(12) United States Patent
Lee et al.

(10) Patent No.: US 12,191,997 B2
(45) Date of Patent: Jan. 7, 2025

(54) METHOD AND APPARATUS FOR PERFORMING CHANNEL CODING AND DECODING IN COMMUNICATION OR BROADCASTING SYSTEM

(71) Applicant: Samsung Electronics Co., Ltd., Gyeonggi-do (KR)

(72) Inventors: Hyojin Lee, Seoul (KR); Taehyoung Kim, Seoul (KR); Sungjin Park, Incheon (KR); Jeongho Yeo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 18/519,771

(22) Filed: Nov. 27, 2023

(65) Prior Publication Data

US 2024/0113808 A1    Apr. 4, 2024

Related U.S. Application Data

(63) Continuation of application No. 17/966,352, filed on Oct. 14, 2022, now Pat. No. 11,870,572, which is a
(Continued)

(30) Foreign Application Priority Data

Jun. 15, 2017    (KR) .................. 10-2017-0075935
Jun. 28, 2017    (KR) .................. 10-2017-0082027

(51) Int. Cl.
*H04L 1/00*    (2006.01)
*H03M 13/11*    (2006.01)
(Continued)

(52) U.S. Cl.
CPC ......... *H04L 1/0057* (2013.01); *H03M 13/116* (2013.01); *H04L 1/0003* (2013.01);
(Continued)

(58) Field of Classification Search
CPC .. H03M 13/116; H04L 1/0003; H04L 1/0011; H04L 1/0041; H04L 1/0057; H04L 1/1812; H04L 5/0053; H04W 72/042
See application file for complete search history.

(56) References Cited

U.S. PATENT DOCUMENTS

7,301,929 B2    11/2007    Frederiksen
7,720,041 B2    5/2010    Frederiksen
(Continued)

FOREIGN PATENT DOCUMENTS

CA    2749781    9/2010
CN    101902313    3/2013
(Continued)

OTHER PUBLICATIONS

Ericsson, TBS scaling for short TTI, May 15, 2017, 3GPP TSG-RAN WG1 Meeting #89, Hangzhou, P.R. China, Tdoc: R1-1708849 (Year: 2017).*
(Continued)

*Primary Examiner* — Eric Nowlin
(74) *Attorney, Agent, or Firm* — The Farrell Law Firm, P.C.

(57) ABSTRACT

Disclosed is a method performed by a user equipment (UE) in a communication system, including receiving, from a base station, downlink control information (DCI) including resource assignment information for a physical downlink shared channel (PDSCH); identifying a number of resource elements (REs) allocated for the PDSCH based on a number symbols for the PDSCH and a number of allocated physical resource blocks (PRBs), wherein a number of REs for a demodulation reference signal (DMRS) is excluded from the number of REs allocated for the PDSCH; identifying intermediate information based on the number of REs allocated for the PDSCH; identifying a transport block size (TBS)
(Continued)

based on quantized intermediate information; and receiving, from the base station, the PDSCH based on the TBS.

20 Claims, 13 Drawing Sheets

Related U.S. Application Data continuation of application No. 16/621,156, filed as application No. PCT/KR2018/006761 on Jun. 15, 2018, now Pat. No. 11,528,091.

(51) Int. Cl.
*H04L 1/1812* (2023.01)
*H04L 5/00* (2006.01)
*H04W 72/23* (2023.01)

(52) U.S. Cl.
CPC .......... *H04L 1/0011* (2013.01); *H04L 1/0041* (2013.01); *H04L 1/1812* (2013.01); *H04L 5/0053* (2013.01); *H04W 72/23* (2023.01)

(56) References Cited

U.S. PATENT DOCUMENTS

| | | | |
|---|---|---|---|
| 8,000,310 B2 | 8/2011 | Frederiksen | |
| 8,724,448 B2 | 5/2014 | Roessel | |
| 8,948,076 B2 | 2/2015 | Kim | |
| 9,806,864 B2 | 10/2017 | Kim | |
| 10,117,241 B1 | 10/2018 | Zhou | |
| 10,154,515 B1 | 12/2018 | Oroskar | |
| 10,285,167 B2 | 5/2019 | Chen | |
| 10,425,938 B2 | 9/2019 | Kang | |
| 10,485,003 B2 | 11/2019 | Zhang | |
| 10,491,348 B2 | 11/2019 | Cheng | |
| 10,530,441 B2 | 1/2020 | Davydov | |
| 10,530,442 B2 | 1/2020 | Davydov | |
| 10,651,968 B2 | 5/2020 | Tang | |
| 10,742,349 B2 | 8/2020 | Yeo | |
| 10,880,888 B2 * | 12/2020 | Guo | ......... H04L 69/24 |
| 10,897,292 B2 | 1/2021 | Davydov | |
| 10,939,321 B2 | 3/2021 | Davydov | |
| 11,051,202 B2 * | 6/2021 | Davydov | ............. H04W 28/10 |
| 11,190,300 B2 * | 11/2021 | Hwang | ................. H04L 1/0009 |
| 11,212,054 B2 | 12/2021 | Xu | |
| 11,323,201 B2 | 5/2022 | Yeo | |
| 11,528,091 B2 | 12/2022 | Lee | |
| 11,638,251 B2 * | 4/2023 | Guo | ..................... H04L 1/0003 370/329 |
| 11,991,674 B2 * | 5/2024 | Guo | ..................... H04W 72/23 |
| 2004/0028020 A1 | 2/2004 | Frederiksen | |
| 2008/0123684 A1 | 5/2008 | Frederiksen | |
| 2009/0185638 A1 | 7/2009 | Imamura | |
| 2010/0208635 A1 | 8/2010 | Frederiksen | |
| 2010/0303016 A1 * | 12/2010 | Jin | ...................... H04L 27/0008 370/328 |
| 2011/0274075 A1 | 11/2011 | Lee | |
| 2012/0039282 A1 | 2/2012 | Kim | |
| 2012/0163319 A1 | 6/2012 | Roessel | |
| 2012/0314678 A1 | 12/2012 | Ko | |
| 2012/0327884 A1 | 12/2012 | Sao | |
| 2014/0254452 A1 | 9/2014 | Golitschek Edler Von Elbwart | |
| 2015/0009927 A1 | 1/2015 | Larsson et al. | |
| 2015/0063280 A1 | 3/2015 | Nan | |
| 2015/0085767 A1 | 3/2015 | Einhaus | |
| 2015/0085794 A1 | 3/2015 | Chen | |
| 2015/0103760 A1 | 4/2015 | Zhang | |
| 2015/0117396 A1 | 4/2015 | Wang et al. | |
| 2015/0124753 A1 | 5/2015 | Kim | |
| 2015/0271802 A1 | 9/2015 | Kang et al. | |
| 2015/0289237 A1 | 10/2015 | Kim et al. | |
| 2015/0319776 A1 | 11/2015 | Seo | |
| 2017/0064689 A1 | 3/2017 | Nimbalker et al. | |
| 2017/0135098 A1 | 5/2017 | Kang | |
| 2017/0325205 A1 | 11/2017 | Zhou | |
| 2018/0054757 A1 | 2/2018 | Nanri | |
| 2018/0115962 A1 | 4/2018 | Kim | |
| 2019/0028229 A1 | 1/2019 | Yeo | |
| 2019/0036640 A1 | 1/2019 | Xu | |
| 2019/0044642 A1 | 2/2019 | Wikstrom | |
| 2019/0045390 A1 * | 2/2019 | Davydov | ............. H04W 28/10 |
| 2019/0081729 A1 | 3/2019 | Salah | |
| 2019/0149287 A1 * | 5/2019 | Cheng | ................... H04L 1/0009 370/280 |
| 2019/0158221 A1 | 5/2019 | Sarkis | |
| 2019/0229860 A1 | 7/2019 | Yoshimura | |
| 2019/0229861 A1 | 7/2019 | Yoshimura | |
| 2019/0253229 A1 | 8/2019 | Hosseini | |
| 2019/0254038 A1 | 8/2019 | Zhang | |
| 2019/0260440 A1 | 8/2019 | Davydov | |
| 2019/0260530 A1 | 8/2019 | Yi | |
| 2019/0327018 A1 * | 10/2019 | Tang | ..................... H04L 1/0004 |
| 2019/0327730 A1 | 10/2019 | Sandberg | |
| 2019/0341983 A1 | 11/2019 | Davydov | |
| 2019/0357224 A1 | 11/2019 | Li | |
| 2019/0379511 A1 | 12/2019 | Xu | |
| 2020/0037317 A1 * | 1/2020 | Guo | ..................... H04L 1/0003 |
| 2020/0067666 A1 | 2/2020 | Cheng | |
| 2020/0092856 A1 | 3/2020 | Horiuchi | |
| 2020/0100224 A1 | 3/2020 | Khoshnevisan | |
| 2020/0112948 A1 | 4/2020 | Wang | |
| 2020/0128438 A1 | 4/2020 | Wang | |
| 2020/0128529 A1 | 4/2020 | Wang | |
| 2020/0137616 A1 * | 4/2020 | Davydov | .......... H04W 28/0273 |
| 2020/0153538 A1 | 5/2020 | Chen | |
| 2020/0252113 A1 | 8/2020 | Davydov | |
| 2020/0287655 A1 | 9/2020 | Tang | |
| 2020/0374029 A1 | 11/2020 | Yeo | |
| 2020/0374920 A1 | 11/2020 | Tie | |
| 2021/0136757 A1 | 5/2021 | Guo | |
| 2021/0143932 A1 | 5/2021 | Xu | |
| 2021/0144738 A1 | 5/2021 | Yoshioka | |
| 2021/0211232 A1 | 7/2021 | Hwang | |
| 2021/0258827 A1 | 8/2021 | Sarkis | |
| 2022/0201711 A1 | 6/2022 | Lee | |
| 2023/0300808 A1 * | 9/2023 | Guo | ..................... H04L 69/24 370/329 |
| 2024/0298303 A1 * | 9/2024 | Guo | ..................... H04L 69/24 |

FOREIGN PATENT DOCUMENTS

| | | | |
|---|---|---|---|
| CN | 103534969 | 8/2017 | |
| CN | 109565361 A * | 4/2019 | ............... H04L 1/00 |
| CN | 109803426 A * | 5/2019 | ........... H04L 1/0003 |
| CN | 110999146 | 4/2020 | |
| CN | 111373710 A * | 7/2020 | ........... H04L 1/0003 |
| CN | 111092693 | 3/2021 | |
| CN | 111373710 B * | 9/2021 | ........... H04L 1/0003 |
| CN | 109565361 B * | 10/2021 | ............... H04L 1/00 |
| CN | 114006676 A * | 2/2022 | ........... H04L 1/0003 |
| CN | 109803426 B * | 4/2023 | ........... H04L 1/0003 |
| CN | 114006676 B * | 5/2023 | ........... H04L 1/0003 |
| EP | 2 449 707 | 4/2013 | |
| EP | 2 830 345 | 1/2015 | |
| EP | 3 295 689 | 3/2018 | |
| EP | 3471304 A1 * | 4/2019 | ............... H04L 1/00 |
| EP | 3606242 A1 * | 2/2020 | ........... H04L 1/0003 |
| EP | 3 642 982 | 4/2020 | |
| EP | 3577874 B1 * | 5/2021 | ........... H04L 1/0003 |
| EP | 3471304 B1 * | 11/2021 | ............... H04L 1/00 |
| EP | 3913828 A1 * | 11/2021 | ........... H04L 1/0003 |
| EP | 3606242 B1 * | 2/2022 | ........... H04L 1/0003 |
| ES | 2746751 | 3/2020 | |
| ES | 2880040 T3 * | 11/2021 | ........... H04L 1/0003 |
| JP | 6052650 | 12/2016 | |
| JP | 2019537313 A * | 12/2019 | |
| JP | 6802369 B2 * | 12/2020 | ............... H04L 1/00 |
| JP | 2021512517 A * | 5/2021 | |
| JP | 7071500 B2 * | 5/2022 | ........... H04L 1/0003 |
| KR | 20100099650 | 9/2010 | |
| KR | 20150076220 | 7/2015 | |
| KR | 10-2015-0111823 | 10/2015 | |
| KR | 101740412 | 5/2017 | |

(56) References Cited

FOREIGN PATENT DOCUMENTS

| | | |
|---|---|---|
| KR | 20180008626 | 1/2018 |
| KR | 20180135868 A * | 12/2018 |
| KR | 20190018766 A * | 2/2019 |
| KR | 102084551 | 3/2020 |
| KR | 102105052 B1 * | 4/2020 |
| KR | 20200088870 A * | 7/2020 |
| KR | 102252227 B1 * | 5/2021 |
| KR | 102445007 B1 * | 9/2022 |
| PT | 2830345 | 9/2019 |
| WO | WO 2010/101414 | 9/2010 |
| WO | WO 2011/000441 | 1/2011 |
| WO | WO 2011/160449 | 12/2011 |
| WO | WO 2014/088294 | 6/2014 |
| WO | WO 2015/141961 | 9/2015 |
| WO | WO 2016/181031 | 11/2016 |
| WO | WO 2017/076438 | 5/2017 |
| WO | WO-2018174564 A1 * | 9/2018 ............... H04L 1/00 |
| WO | WO 2019/017749 | 1/2019 |
| WO | WO-2019096022 A1 * | 5/2019 ........... H04L 1/0003 |
| WO | WO 2019/199070 | 10/2019 |
| WO | WO 2022/032659 | 2/2022 |

OTHER PUBLICATIONS

PCT/ISA/210 Search Report issued on PCT/KR2018/006761, pp. 5.
PCT/ISA/237 Written Opinion issued on PCT/KR2018/006761, pp. 7.
Huawei, HiSilicon, "Discussion on sPDSCH Design", R1-1701735, 3GPP TSG RAN WG1 Meeting #88, Feb. 13-17, 2017, 6 pages.
Korean Office Action dated Jan. 13, 2022 Issued in counterpart application No. 10-2017-0082027, 9 pages.
Korean Office Action dated Aug. 9, 2022 issued in counterpart application No. 10-2022-0077418, 12 pages.
Ericsson, TBS scaling for short TTI, May 15, 2017, 3GPP TSG-RAN WG1 Meeting #89, Tdoc: R1-1708849 (Year: 2017).

* cited by examiner

METHOD AND APPARATUS FOR PERFORMING CHANNEL CODING AND DECODING IN COMMUNICATION OR BROADCASTING SYSTEM

PRIORITY

This application is a Continuation Application of U.S. patent application Ser. No. 17/966,352, which was filed in the U.S. Patent and Trademark Office (USPTO) on Oct. 14, 2022, which is a Continuation Application of U.S. patent application Ser. No. 16/621,156, which was filed in the USPTO on Dec. 10, 2019, issued as U.S. Pat. No. 11,528,091 on Dec. 13, 2022, which is a National Phase Entry of PCT International Application No. PCT/KR2018/006761, which was filed on Jun. 15, 2018, and claims priority to Korean Patent Application Nos. 10-2017-0075935 and 10-2017-0082027, which were filed on Jun. 15, 2017, and Jun. 28, 2017, respectively, the entire content of each of which is incorporated herein by reference.

TECHNICAL FIELD

The disclosure relates to a method and an apparatus for performing channel coding and decoding in a communication or broadcasting system.

BACKGROUND ART

In order to meet wireless data traffic demands that have increased after 4G communication system commercialization, efforts to develop an improved 5G communication system or a pre-5G communication system have been made. For this reason, the 5G communication system or the pre-5G communication system is called a beyond 4G network communication system or a post LTE system. In order to achieve a high data transmission rate, an implementation of the 5G communication system in a mmWave band (for example, 60 GHz band) is being considered. In the 5G communication system, technologies such as beamforming, massive MIMO, full dimensional MIMO (FD-MIMO), array antenna, analog beam-forming, and large scale antenna are being discussed as means to mitigate a propagation path loss in the mmWave band and increase a propagation transmission distance. Further, the 5G communication system has developed technologies such as an evolved small cell, an advanced small cell, a cloud radio access network (RAN), an ultra-dense network, device to device communication (D2D), a wireless backhaul, a moving network, cooperative communication, coordinated multi-points (CoMP), and received interference cancellation to improve the system network. In addition, the 5G system has developed advanced coding modulation (ACM) schemes such as hybrid FSK and QAM modulation (FQAM) and sliding window superposition coding (SWSC), and advanced access technologies such as filter bank multi carrier (FBMC), non-orthogonal multiple access (NOMA), and sparse code multiple access (SCMA).

Meanwhile, the Internet has been evolved to an Internet of Things (IoT) network in which distributed components such as objects exchange and process information from a human-oriented connection network in which humans generate and consume information. An Internet of everything (IoE) technology in which a big data processing technology through a connection with a cloud server or the like is combined with the IoT technology has emerged. In order to implement IoT, technical factors such as a sensing technique, wired/wireless communication, network infrastructure, service-interface technology, and security technology are required, and research on technologies such as a sensor network, machine-to-machine (M2M) communication, machine-type communication (MTC), and the like for connection between objects has recently been conducted. In an IoT environment, through collection and analysis of data generated in connected objects, an intelligent Internet technology (IT) service to create a new value for peoples' lives may be provided. The IoT may be applied to fields, such as a smart home, smart building, smart city, smart car, connected car, smart grid, health care, smart home appliance, or high-tech medical service, through the convergence of the conventional Information technology (IT) and various industries.

Accordingly, various attempts to apply the 5G communication system to the IoT network are made. For example, technologies such as a sensor network, machine-to-machine (M2M), and machine-type communication (MTC) are implemented by beamforming, MIMO, and array antenna schemes. The application of a cloud RAN as the big data processing technology may be an example of convergence of the 5G technology and the IoT technology.

In a communication/broadcasting system, link performance may significantly deteriorate due to various channel noise, fading phenomenon, and inter-symbol interference (ISI). Accordingly, in order to realize high-speed digital communication and broadcasting systems that require high data throughput and high reliability such as next-generation mobile communication, digital broadcasting, and portable Internet, it is needed to develop a technology for removing noise, fading, and inter-symbol interference. As research on noise removal, research on an error correcting code is actively performed recently for a method of increasing reliability of communication by efficiently reconstructing distortion of information.

DETAILED DESCRIPTION OF THE INVENTION

Technical Problem

The disclosure provides a method and an apparatus for transmitting a coding bit which may support various input lengths and code rates. Further, the disclosure provides a method of configuring a base graph of an LDPC code used for data channel transmission and a method and an apparatus for segmenting a transport block using the LDPC code.

Solution to Problem

In accordance with an aspect of the disclosure, a method performed by a user equipment (UE) in a communication system includes receiving, from a base station, downlink control information (DCI) including resource assignment information for a physical downlink shared channel (PDSCH); identifying a number of resource elements (REs) allocated for the PDSCH based on a number symbols for the PDSCH and a number of allocated physical resource blocks (PRBs), wherein a number of REs for a demodulation reference signal (DMRS) is excluded from the number of REs allocated for the PDSCH; identifying intermediate information based on the number of REs allocated for the PDSCH; identifying a transport block size (TBS) based on quantized intermediate information; and receiving, from the base station, the PDSCH based on the TBS.

In accordance with an aspect of the disclosure, a method performed by a base station in a communication system includes identifying a TBS for a PDSCH; transmitting, to a UE, DCI including resource assignment information for the PDSCH; and transmitting, to the UE, the PDSCH according to the TBS. The TBS is associated with quantized intermediate information. The quantized intermediate information is associated with a number of REs allocated for the PDSCH. The number of REs allocated for the PDSCH is associated with a number symbols for the PDSCH and a number of allocated PRBs. A number of REs for a demodulation reference signal (DMRS) is excluded from the number of REs allocated for the PDSCH.

In accordance with an aspect of the disclosure, a UE in a communication system includes a transceiver; and at least one processor configured to receive, from a base station, DCI including resource assignment information for a PDSCH, identify a number of REs allocated for the PDSCH based on a number symbols for the PDSCH and a number of allocated PRBs, wherein a number of REs for a DMRS is excluded from the number of REs allocated for the PDSCH, identify intermediate information based on the number of REs allocated for the PDSCH, identify a TBS based on quantized intermediate information, and receive, from the base station, the PDSCH based on the TBS.

In accordance with an aspect of the disclosure, a base station in a communication system includes a transceiver; and at least one processor configured to identify a TBS for a PDSCH, transmit, to a UE, DCI including resource assignment information for the PDSCH, and transmit, to the UE, the PDSCH according to the TBS. The TBS is associated with quantized intermediate information. The quantized intermediate information is associated with a number of REs allocated for the PDSCH. The number of REs allocated for the PDSCH is associated with a number symbols for the PDSCH and a number of allocated PRBs. A number of REs for a DMRS is excluded for the number of REs allocated for the PDSCH.

Advantageous Effects of Invention

The disclosure can satisfy various service requirements of a next-generation mobile communication system using an LDPC code that can be applied to a variable length and a variable rate. Further, the disclosure can support efficient operation of the LDPC which is a data channel coding method.

MODE FOR THE INVENTION

Figure 1:
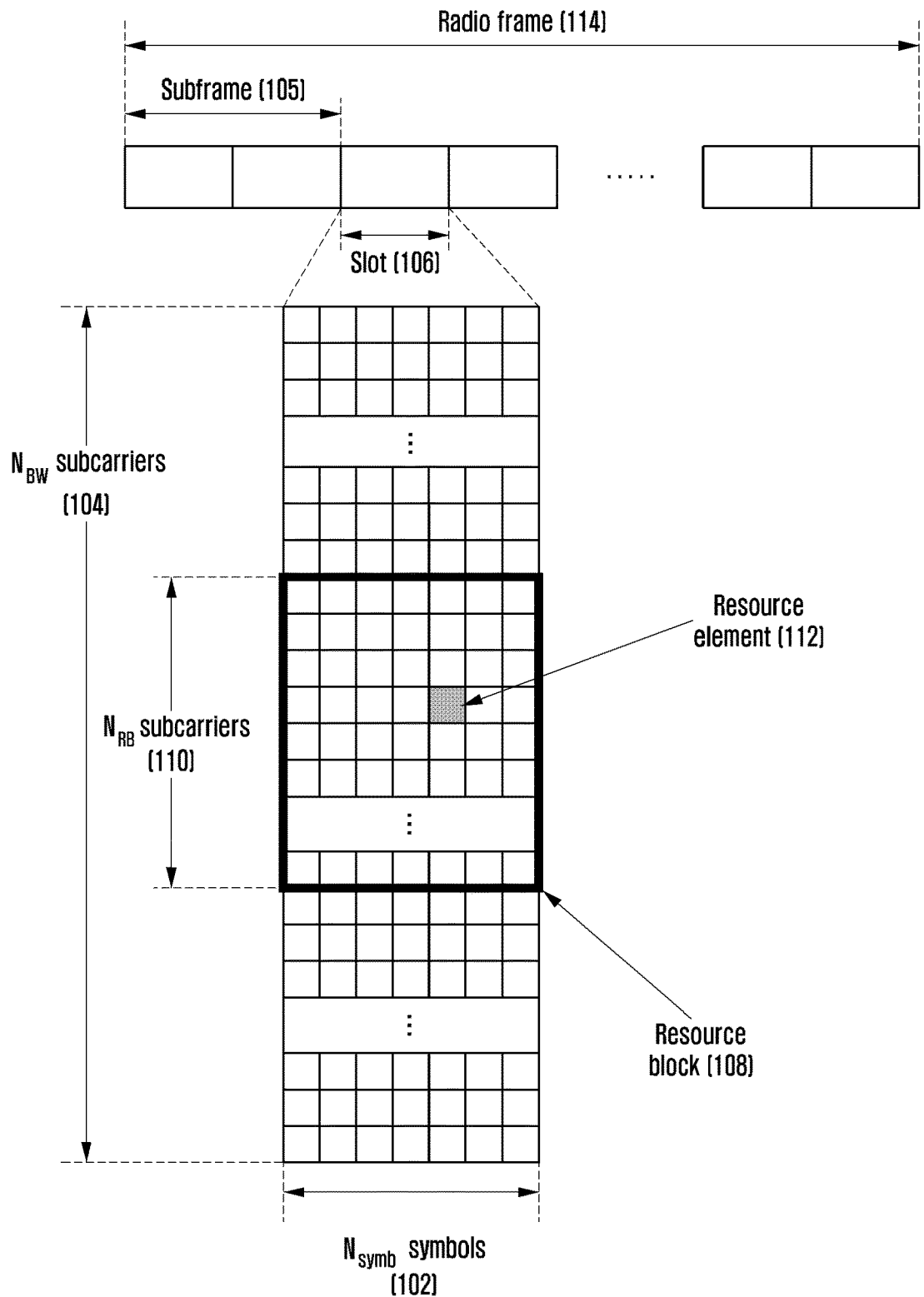
FIG. 1 illustrates the structure of transmission in downlink time-frequency domains in an LTE or LTE-A system.

Hereinafter, embodiments of the disclosure will be described in detail with reference to the accompanying drawings.

In describing the exemplary embodiments of the disclosure, descriptions related to technical contents which are well-known in the art to which the disclosure pertains, and are not directly associated with the disclosure, will be omitted. Such an omission of unnecessary descriptions is intended to prevent obscuring of the main idea of the disclosure and more clearly transfer the main idea.

For the same reason, in the accompanying drawings, some elements may be exaggerated, omitted, or schematically illustrated. Further, the size of each element does not entirely reflect the actual size. In the drawings, identical or corresponding elements are provided with identical reference numerals.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Here, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

And each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the "unit" refers to a software element or a hardware element, such as a Field Programmable Gate Array (FPGA) or an Application Specific Integrated Circuit (ASIC), which performs a predetermined function. However, the "unit does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, "unit" or divided into a larger number of elements, "unit". Moreover, the elements and "units" may be implemented to reproduce one or more CPUs within a device or a security multimedia card. Also, in an embodiment, '~unit' may include one or more processors.

A wireless communication system has developed to be a broadband wireless communication system that provides a high speed and high quality packet data service, like the communication standards, for example, high speed packet access (HSPA) of 3GPP, long term evolution (LTE) or evolved universal terrestrial radio access (E-UTRA), LTE-advanced (LTE-A), high rate packet data (HRPD) of 3GPP2, ultra mobile broadband (UMB), and 802.16e of IEEE, or the like, beyond the voice-based service provided at the initial stage. Also, a communication standard of 5G or new radio (NR) is being developed as a $5^{th}$-generation wireless communication system.

As described above, the wireless communication system including $5^{th}$ generation may provide at least one service of enhanced mobile broadband (eMBB), massive machine type communications (mMTC), and ultra-reliable and low-latency communications (URLLC) to a terminal. The services may be provided to the same terminal during the same time interval. The eMBB may be a service aiming at high-speed transmission of high-capacity data, the mMTC may be a service aiming at minimization of terminal power consumption and access of a plurality of terminals, and the URLLC may be a service aiming at high reliability and low latency, but are not limited thereto. The three services may be main scenarios in an LTE system or a system such as 5G or new radio (or next radio (NR)) after LTE.

Hereinafter, an embodiment of the disclosure will be described in detail with reference to the accompanying drawings. In the following description of the disclosure, a detailed description of known functions or configurations incorporated herein will be omitted when it may make the subject matter of the disclosure rather unclear. The terms which will be described below are terms defined in consideration of the functions in the disclosure, and may be different according to users, intentions of the users, or customs. Therefore, the definitions of the terms should be made based on the contents throughout the specification.

Hereinafter, the eNB is the entity that allocates resources to the terminal and may be at least one of a gNode B, an eNode B, a Node B, a base station (BS), a radio access unit, an eNB controller, and a node on a network. The terminal may include a UE, a mobile station (MS), a cellular phone, a smart phone, a computer, or a multimedia system capable of performing a communication function. In the disclosure, a downlink (DL) refers to a wireless transmission path of a signal that the eNB transmits to the terminal, and an uplink (UL) refers to a wireless transmission path of a signal that the terminal transmits to the eNB.

Embodiments of the disclosure will be described on the basis of an LTE or LTE-A system or an NR system but may be applied to other communication systems having a similar technical background or channel form. Further, embodiments of the disclosure may be applied to other communication systems through some modifications without departing from the scope of the disclosure on the basis of determination by those skilled in the art.

An LTE system, which is a representative example of the broadband wireless communication system, employs an orthogonal frequency division multiplexing (OFDM) scheme for a downlink (DL) and employs a single carrier frequency division multiple access (SC-FDMA) scheme for an uplink (UL). In such a multi-access scheme, time-frequency resources for carrying data or control information are allocated and operated in a manner to prevent overlapping of resources, that is, to establish orthogonality, between users so as to identify data or control information of each user.

If decoding fails at the initial transmission, the LTE system employs hybrid automatic repeat request (HARQ) that retransmits the corresponding data in a physical layer. In the HARQ scheme, if a receiver does not accurately decode data, the receiver transmits information (negative acknowledgement: NACK) informing a transmitter of a decoding failure and thus the transmitter may re-transmit the corresponding data on the physical layer. The receiver increases data reception performance by combining the data retransmitted by the transmitter with the data of which decoding has previously failed. If the receiver accurately decodes data, the receiver transmits information (ACK) reporting that decoding is successfully executed to the transmitter so that the transmitter transmits new data.

Hereinafter, a higher layer signal according to the disclosure is a signal such as a system information block (SIB), radio resource control (RRC), or a media access control (MAC) control element (CE) and semi-statically or/and statically supports specific operation control of the terminal, and a physical signal is an L1 signal and dynamically supports specific operation control of the terminal in the form of UE-common downlink control information or UE-specific downlink control information.

FIG. 1 illustrates a basic structure of time-frequency domains which are radio resource domains in which data or a control channel is transmitted in downlink of an LTE system or a system similar thereto.

Referring to FIG. 1, the horizontal axis indicates the time domain and the vertical axis indicates the frequency domain. A minimum transmission unit in the time domain is an OFDM symbol. One slot 106 consists of $N_{symb}$ OFDM symbols 102 and one subframe 105 consists of 2 slots. The length of one slot is 0.5 ms, and the length of one subframe is 1.0 ms. A radio frame 114 is a time domain interval consisting of 10 subframes. In the frequency domain, the minimum transmission unit is a subcarrier. A bandwidth of the entire system transmission band consists of a total of $N_B W$ subcarriers 104. However, such detailed values may be variable.

A basic unit of resources in the time-frequency domains is a resource element (RE) 112, and may be indicated by an OFDM symbol index and a subcarrier index. A Resource Block (RB or PRB) 108 is defined by $N_{symb}$ successive OFDM symbols 102 in the time domain and $N_{RB}$ successive subcarriers 110 in the frequency domain. Accordingly, in one slot, one RB 108 may include $N_{symb} \times N_{RB}$ REs 112. In general, a minimum data allocation unit in the frequency domain is the RB, and $N_{symb}=7$, $N_{RB}=12$, and $N_{BW}$ may be proportional to the bandwidth of the system transmission band in the LTE system. A data rate increases in proportion to the number of RBs scheduled for the terminal.

The LTE system may operate with definition of 6 transmission bandwidths. In the case of a frequency division duplex (FDD) system, in which the downlink and the uplink are divided by the frequency, a downlink transmission bandwidth and an uplink transmission bandwidth may be different from each other. A channel bandwidth may indicate an RF bandwidth corresponding to a system transmission bandwidth. [Table 1] provided below indicates a relationship between a system transmission bandwidth and a channel bandwidth defined in the LTE system. For example, the LTE system having a channel bandwidth of 10 MHz may have a transmission bandwidth consisting of 50 RBs.

TABLE 1

| | Channel bandwidth $BW_{channel}$ [MHz] | | | | | |
|---|---|---|---|---|---|---|
| | 1.4 | 3 | 5 | 10 | 15 | 20 |
| Transmission bandwidth configuration $N_{RB}$ | 6 | 15 | 25 | 50 | 75 | 100 |

Downlink control information may be transmitted within first N OFDM symbols in the subframe. Generally, N={1, 2, 3} in an embodiment. Accordingly, N may be variable for each subframe according to an amount of control information to be transmitted in the current subframe. The downlink control information to be transmitted may include a control channel transmission interval indicator indicating how many OFDM symbols are used for transmitting the control information, scheduling information of downlink data or uplink data, and information on HARQ ACK/NACK.

In the LTE system, the scheduling information of downlink data or uplink data is transmitted from the eNB to the terminal through downlink control information (DCI). The DCI is defined in various formats. The determined DCI format is applied and operated according to whether the DCI is scheduling information (UL grant) for uplink data or scheduling information (DL grant) for downlink data, whether the DCI is compact DCI having small size control information, whether the DCI applies spatial multiplexing using multiple antennas, and whether the DCI is DCI for controlling power. For example, DCI format 1 which is scheduling control information (DL grant) of downlink data may include one of pieces of the following information:

Resource allocation type 0/1 flag: indicates whether a resource allocation type is type 0 or type 1. Type 0 applies a bitmap scheme and allocates resources in units of resource block groups (RBGs). In the LTE system, a basic scheduling unit is a resource block (RB) expressed by time and frequency domain resources, and an RBG includes a plurality of RBs and is used as a basic scheduling unit in the type 0 scheme. Type 1 allows allocation of a predetermined RB in an RBG.

Resource block assignment: indicates RBs allocated to data transmission. Expressed resources are determined according to the system bandwidth and the resource allocation type.

Modulation and coding scheme (MCS): indicates a modulation scheme used for data transmission and the size of a transport block (TB) which is data to be transmitted.

HARQ process number: indicates a process number of HARQ.

New data indicator: indicates HARQ initial transmission or HARQ retransmission.

Redundancy version: indicates a redundancy version of HARQ.

Transmit power control (TPC) command for physical uplink control channel (PUCCH): indicates a transmission power control command for a PUCCH which is an uplink control channel.

The DCI may be transmitted through a physical downlink control channel (PDCCH) or enhanced PDCCH (EPDCCH) which is a physical control channel via a channel-coding and modulation process. Hereinafter, PDCCH or EPDCCH transmission may be interchangeable with DCI transmission through the PDCCH or the EPDCCH. Such a technology may be applied to other channels, and, for example, downlink data transmission may be interchangeable with PDSCH transmission.

In general, the DCI is scrambled with a particular radio network temporary identifier (RNTI) (or a terminal identifier), independently for each terminal, a cyclic redundancy check (CRC) bit is added thereto, and then channel coding is performed, whereby each independent PDCCH is configured and transmitted. In the time domain, the PDCCH is mapped and transmitted during the control channel transmission interval. The mapping location of the PDCCH in the frequency domain may be determined by an identifier (ID) of each terminal and distributed to the entire system transmission band.

Downlink data may be transmitted on the PDSCH which is a downlink data transmission physical channel. The PDSCH may be transmitted after the control channel transmission interval, and scheduling information such as the detailed mapping location in the frequency domain and the modulation scheme is determined on the basis of the DCI transmitted through the PDCCH.

Via an MCS in the control information included in the DCI, the eNB reports the modulation scheme applied to the PDSCH to be transmitted to the terminal and the size (e.g., TBS) of data to be transmitted. According to an embodiment, the MCS may include 5 bits or bits larger than or smaller than 5 bits. The TBS corresponds to the size before channel coding for error correction is applied to the data transport block to be transmitted by the eNB.

The modulation scheme supported by the LTE system includes Quadrature Phase Shift Keying (QPSK), 16 Quadrature Amplitude Modulation (16 QAM), and 64 QAM. Modulation orders (Qm) correspond to 2, 4, and 6 respectively. That is, the eNB may transmit 2 bits per symbol in the QPSK modulation, 4 bits per symbol in the 16 QAM, and 6 bits per symbol in the 64 QAM. Further, a modulation scheme higher than or equal to 256 QAM may be used according to system deformation.

Figure 2:
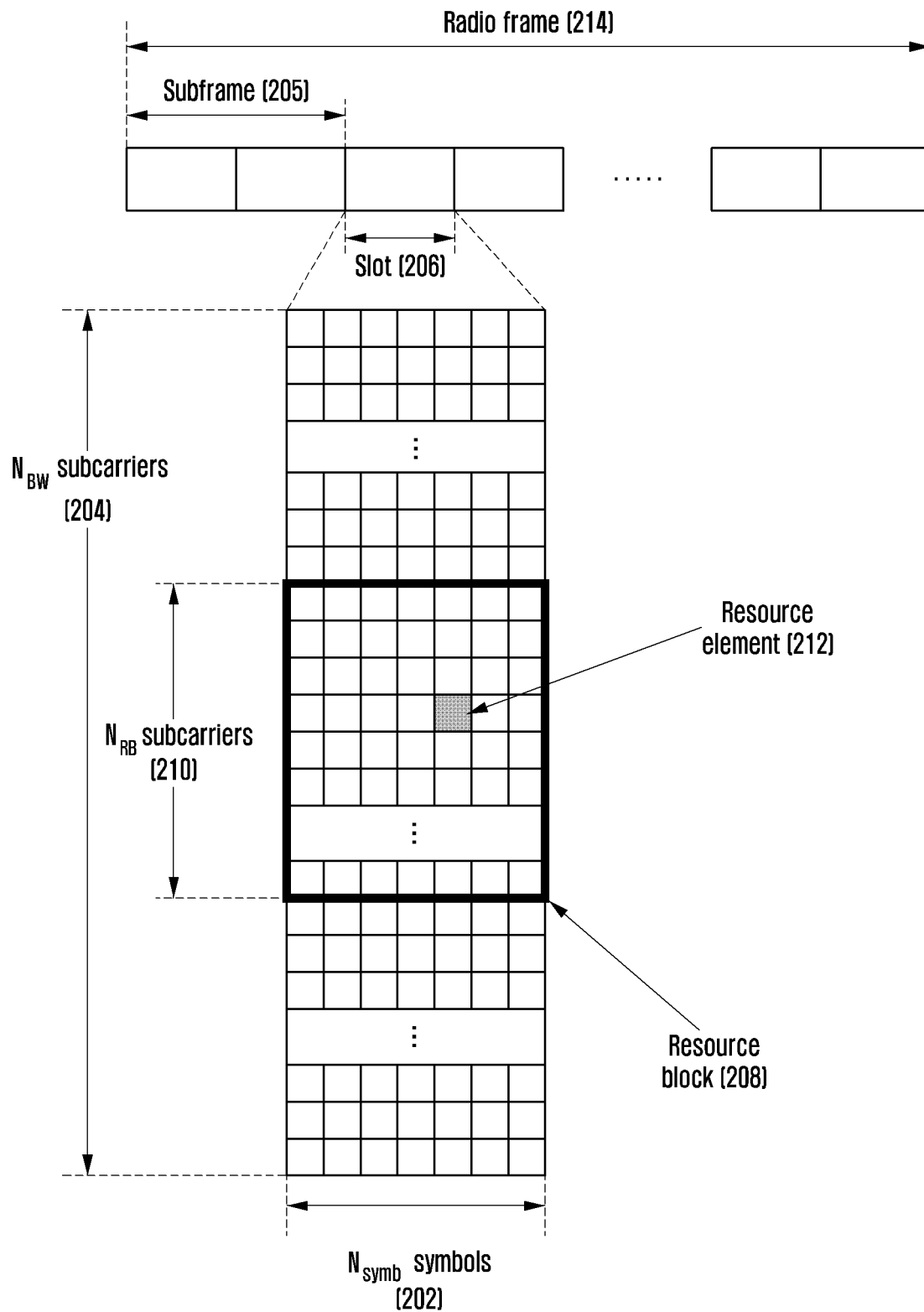
FIG. 2 illustrates the uplink time-frequency domain transmission structure of the LTE or LTE-A system.

FIG. 2 illustrates a basic structure of time-frequency domains which are radio resource domains in which data or a control channel is transmitted in uplink of the LTE system or a system similar thereto.

Referring to FIG. 2, the horizontal axis indicates the time domain and the vertical axis indicates the frequency domain. A minimum transmission unit in the time domain is an SC-FDMA symbol, and one slot 206 consists of $N_{symb}$ SC-FDMA symbols 202. One subframe 205 consists of two slots. A minimum transmission unit in the frequency domain is a subcarrier, and the bandwidth of the entire system transmission band consists of a total of $N_{BW}$ subcarriers 204. $N_{BW}$ may have a value proportional to the system transmission band.

The basic unit of resources in the time-frequency domains is a resource element (RE) 212, and may be defined by an SC-FDMA symbol index and a subcarrier index. A resource block 208 may be defined by $N_{symb}$ consecutive SC-FDMA symbols in the time domain and $N_{RB}$ consecutive subcarriers in the frequency domain. Accordingly, one RB consists of $N_{symb} \times N_{RB}$ REs. In general, a minimum transmission unit of data or control information is an RB unit. A PUCCH is mapped to a frequency domain corresponding to 1 RB, and may be transmitted during one subframe.

The timing relationship of a PUCCH or a PUSCH, which is an uplink physical channel for transmitting HARQ ACK/NACK corresponding to a PDSCH, which is a downlink data transmission physical channel, or a PDCCH or an EPDCCH including semi-persistent scheduling release (or SPS release) may be defined in the LTE system. For example, in the LTE system operating in FDD type, HARQ ACK/NACK corresponding to a PDSCH transmitted in an $(n-4)^{th}$ subframe or a PDCCH or an EPDCCH including SRS release may be transmitted to a PUCCH or a PUSCH in an $n^{th}$ subframe.

In the LTE system, a downlink HARQ adapts an asynchronous HARQ scheme in which a time point at which data is retransmitted is not fixed. That is, when the eNB receives a HARQ NACK feedback of data which the eNB initially transmits from the terminal, the eNB freely determines the time point at which retransmitted data is transmitted via a scheduling operation. For the HARQ operation, the terminal may buffer data which is determined as an error on the basis of the result of decoding of the received data and then combine the data with the following retransmitted data.

If the terminal receives a PDSCH including downlink data transmitted from the eNB through subframe n, the terminal transmits uplink control information including HARQ ACK or NACK of the downlink data to the eNB through a PUCCH or a PUSCH in subframe n+k. In this instance, k may be defined differently according to FDD or time division duplex (TDD) of the LTE system and a configuration the subframe. For example, in the case of the FDD LTE system, k is fixed to 4. In the case of the TDD LTE system, k may be changed according to a subframe configuration and a subframe number. Further, when data is transmitted through a plurality of carriers, k may be differently applied according to TDD configuration of each carrier.

In the LTE system, unlike downlink HARQ, uplink HARQ adapts a synchronous HARQ scheme in which a time point at which data is transmitted is fixed. That is, the uplink/downlink timing relationship between a physical uplink shared channel (PUSCH), which is an uplink data transmission physical channel, and a PDCCH, which is a preceding downlink control channel, and a physical hybrid indicator channel (PHICH), which is a physical channel for transmitting downlink HARQ ACK/NACK corresponding to uplink data on the PUSCH, may be determined by the following rule.

If the terminal receives a PDCCH including uplink scheduling control information transmitted from the eNB or a PHICH for transmitting downlink HARQ ACK/NACK in subframe n, the terminal transmits uplink data corresponding to the control information through a PUSCH in subframe n+k. In this instance, k may be defined differently according to FDD or TDD of the LTE system, and a configuration thereof. For example, in the case of the FDD LTE system, k may be fixed to 4. Meanwhile, in the case of the TDD LTE system, k may be changed according to a subframe configuration and a subframe number. Further, when data is transmitted through a plurality of carriers, k may be differently applied according to TDD configuration of each carrier.

The terminal may receive a PHICH including information related to downlink HARQ ACK/NACK from the eNB in sub-frame i, and the PHICH corresponds to a PUSCH transmitted by the UE in subframe i–k. In this instance, k is defined differently according to FDD or TDD of the LTE system, and a configuration thereof. For example, in the case of the FDD LTE system, k is fixed to 4. Meanwhile, in the case of the TDD LTE system, k may be changed according to a subframe configuration and a subframe number. Further, when data is transmitted through a plurality of carriers, k may be differently applied according to TDD configuration of each carrier.

TABLE 2

| Transmission mode | DCI format | Search Space | Transmission scheme of PDSCH corresponding to PDCCH |
|---|---|---|---|
| Mode 1 | DCI format 1A | Common and UE specific by C-RNTI | Single-antenna port, port 0 (see subclause 7.1.1) |
|  | DCI format 1 | UE specific by C-RNTI | Single-antenna port, port 0 (see subclause 7.1.1) |
| Mode 2 | DCI format 1A | Common and UE specific by C-RNTI | Transmit diversity (see subclause 7.1.2) |
|  | DCI format 1 | UE specific by C-RNTI | Transmit diversity (see subclause 7.1.2) |
| Mode 3 | DCI format 1A | Common and UE specific by C-RNTI | Transmit diversity (see subclause 7.1.2) |
|  | DCI format 2A | UE specific by C-RNTI | Large delay CDD (see subclause 7.1.3) or Transmit diversity (see subclause 7.1.2) |
| Mode 4 | DCI format 1A | Common and UE specific by C-RNTI | Transmit diversity (see subclause 7.1.2) |
|  | DCI format 2 | UE specific by C-RNTI | Closed-loop spatial multiplexing (see subclause 7.1.4)or Transmit diversity (see subclause 7.1.2) |
| Mode 5 | DCI format 1A | Common and UE specific by C-RNTI | Transmit diversity (see subclause 7.1.2) |
|  | DCI format 1D | UE specific by C-RNTI | Multi-user MIMO (see subclause 7.1.5) |
| Mode 6 | DCI format 1A | Common and UE specific by C-RNTI | Transmit diversity (see subclause 7.1.2) |
|  | DCI format 1B | UE specific by C-RNTI | Closed-loop spatial multiplexing (see subclause 7.1.4) using a single transmission layer |

TABLE 2-continued

| Transmission mode | DCI format | Search Space | Transmission scheme of PDSCH corresponding to PDCCH |
|---|---|---|---|
| Mode 7 | DCI format 1A | Common and UE specific by C-RNTI | If the number of PBCH antenna ports is one, Single-antenna port, port 0 is used (see subclause 7.1.1), otherwise Transmit diversity (see subclause 7.1.2) |
| | DCI format 1 | UE specific by C-RNTI | Single-antenna port; port 5 (see subclause 7.1.1) |
| Mode 8 | DCI format 1A | Common and UE specific by C-RNTI | If the number of PBCH antenna ports is one, Single-antenna port, port 0 is used (see subclause 7.1.1), otherwise Transmit diversity (see subclause 7.1.2) |
| | DCI format 2B | UE specific by C-RNTI | Dual layer transmission; port 7 and 8 (see subclause 7.1.5A) or single-antenna port; port 7 or 8 (see subclause 7.1.1) |

[Table 2] above shows supportable DCI formats according to each transmission mode in a condition set by a C-RNTI in 3GPP TS 36.213. The terminal assumes the existence of the corresponding DCI format in a control area interval according to a preset transmission mode and performs a search and decoding. For example, if transmission mode 8 is indicated to the terminal, the terminal searches for DCI format 1A in a common search space and a UE-specific search space and searches for DCI format 2B only in the UE-specific search space.

The descriptions about the wireless communication system is provided from the perspective of the LTE system, and the disclosure is not limited to the LTE system and may be applied to various wireless communication systems such as NR, 5G, or the like. Further, if the embodiment of the disclosure is applied to another wireless communication system, the k value may also be changed in a system using a modulation scheme corresponding to FDD.

In a communication and broadcasting system, link performance may significantly deteriorate due to various channel noise, fading phenomenon, and inter-symbol interference (ISI). Accordingly, in order to realize high-speed digital communication and broadcasting systems that require high data throughput and high reliability such as next-generation mobile communication, digital broadcasting, and portable Internet, there is a need to develop a technology for removing noise, fading, and inter-symbol interference. As research on noise removal, research on an error correcting code is actively performed recently for a method of increasing reliability of communication by efficiently reconstructing distortion of information.

The disclosure provides a method and an apparatus for transmitting a coding bit which may support various input lengths and code rates. Further, the disclosure provides a method of configuring a base graph of an LDPC code used for data channel transmission and a method and an apparatus for segmenting a transport block using the LDPC code.

Subsequently, a low density parity check (LDPC) code will be described.

The LDPC code is a type of linear block codes, and a process of determining a codeword that satisfies a condition such as [Equation 1] below is included.

$$H \cdot c^T = \begin{bmatrix} h_1 & h_2 & h_3 & \cdots & h_{N_{ldpc}-1} \end{bmatrix} \cdot c^T = \sum_{i=0}^{N_{ldpc}} c_i \cdot h_i \quad \text{[Equation 1]}$$

$c=[c_0, c_1, c_2, \ldots, c_{N_{ldpc}-1}]$ in [Equation 1].

In [Equation 1], H denotes a parity check matrix, C denotes a codeword, $c_i$ denotes an $i^{th}$ bit of a codeword, and Napc denotes a codeword length. Here, $h_i$ denotes an $i^{th}$ column of the parity check matrix (H).

The parity check matrix H includes $N_{ldpc}$ columns, the $N_{ldpc}$ being the same as the number of bits of the LDPC codeword. [Equation 1] means that a sum of the products of $i^{th}$ columns ($h_i$) of the parity check matrix and $i^{th}$ codeword bits ci is "0", so that the $i^{th}$ column $(_i)$ is relevant to the $i^{th}$ codeword bit $c_i$.

For the parity check matrix used in the communication and broadcasting system, a quasi-cyclic LDPC code (or a QC-LDPC code, hereinafter, referred to as the QC-LDPC code) generally using a quasi-cyclic parity check matrix is frequently used for easy implementation.

The QC-LDPC code features a parity check matrix including a 0-matrix (zero matrix) having a square matrix form or a circulant permutation matrix.

As shown in [Equation 2], a permutation matrix P ($P_{ij}$) having the size of Z×Z is defined.

$$P_{i,j} = \begin{cases} 1 & \text{if } i+1 \equiv j \bmod Z \\ 0 & \text{otherwise} \end{cases} \quad \text{[Equation 2]}$$

In [Equation 2], $P_{ij}$(0≤i, j<Z) is an element (entry) in an $i^{th}$ row and a $j^{th}$ column in the matrix P. On the basis of 0≤i<Z for the permutation matrix described above, it may be noted that P is a circulant permutation matrix obtained by circularly shifting each element of an identity matrix having the size of Z×Z to the right by i.

The parity check matrix H of the simplest QC-LDPC code may be indicated as shown in [Table 3] below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{[Equation 3]}$$

If $P^{-1}$ is defined as a 0-matrix having the size of Z×Z, each exponent $a_{ij}$ of the circulant permutation matrix or the 0-matrix has one of the values {−1, 0, 1, 2, ..., Z−1} in [Equation 3] above. Further, it may be noted that the parity check matrix H of [Equation 3] has the size of mZ×nZ since it has n column blocks and m row blocks.

In general, a binary matrix having the size of m×n obtained by replacing the circulant permutation matrix and the 0-matrix in the parity check matrix of [Equation 3] with 1 and 0 is determined as a mother matrix (or a base graph) of the parity check matrix H, and a matrix of integers having the size of m×n obtained by selecting only exponents of the circulant permutation matrix or the 0-matrix as shown in [Equation 4] below is determined as an exponent matrix E(H) of the parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{[Equation 4]}$$

Meanwhile, the performance of an LDPC code may be determined according to the parity check matrix. Accordingly, it is required to design an efficient parity check matrix for an LDPC code having excellent performance. Further, an LDPC encoding and decoding method for supporting various input lengths and code rates is needed.

A method known as lifting is used for efficient design of the QC-LDPC code. The lifting is a method of efficiently designing a very large parity check matrix by configuring a Z value for determining the size of a circulant permutation matrix or a 0-matrix from a given small mother matrix according to a specific rule. The conventional lifting method and a characteristic of the QC-LDPC code designed through the lifting are briefly described below.

If an LDPC code $C_0$ is given, S QC-LDPC codes to be designed through the lifting method are $C_1, C_2, \ldots, C_k, \ldots$, and $C_S$ (similarly, $C_k$ for $1 \leq k \leq S$), a parity check matrix of the QC-LDPC code $C_k$ is $H_k$, and a value corresponding to the size of row blocks and column blocks of the circulant matrix included in the parity check matrix is $Z_k$. $C_0$ corresponds to the smallest LDPC code having a mother matrix of $_{C1}, \ldots,$ and $C_S$ codes as a parity check matrix, a $Z_0$ value corresponding to the size of row blocks and column blocks is 1, and $Z_k < Z_{k+i}$ for $0 \leq k \leq S-1$. For convenience, a parity check matrix $H_k$ of each code $C_k$ has an exponent matrix $E(H_k)) = a_{i,j}^{(k)}$ having the size of m×n, and one of the values $\{-1, 0, 1, 2, \ldots, Z_k-1\}$ is selected as each exponent $a_{i,j}^{(k)}$. The lifting includes steps of $C_0 \rightarrow_{C1} \rightarrow \ldots \rightarrow C_S$ and features $Z_{k+1} = q_{k+1} Z_k$ ($q_{k-1}$ is a positive integer, k=0, 1, . . . , S−1). If only the parity check matrix HS of the $C_S$ is stored by a characteristic of the lifting process, all the QC-LDPC codes $C_0, _{C1}, \ldots, C_S$ can be indicated using [Equation 5] or [Equation 6] below according to the lifting method.

$$E(H_k) \equiv \left\lfloor \frac{Z_k}{Z_S} E(H_S) \right\rfloor \quad \text{[Equation 5]}$$

$$E(H_k) \equiv E(H_S) \bmod Z_k \quad \text{[Equation 6]}$$

[Equation 7] is a most generalized expression of the method.

$$P_{i,j} = f(V_{i,j}, Z) \quad \text{[Equation 7]}$$

In [Equation 7], f(x,y) is a predetermined function having x and y as input values. $V_{i,j}$ is an element corresponding to an $i^{th}$ row and a $j^{th}$ column of an exponent matrix of the parity check matrix corresponding to the largest LDPC code (for example, corresponding to the CS in the above description). $P_{ij}$ is an element corresponding to an $i^{th}$ row and a $j^{th}$ column of an exponent matrix of the parity check matrix corresponding to the LDPC code having a predetermined size (for example, corresponding to the $C_k$ in the above description), and Z is the size of row blocks and column blocks of the circulant matrix included in the parity check matrix of the corresponding LDPC code. Accordingly, if $V_{i,j}$ is defined, a parity check matrix for an LDPC code having a predetermined size can be defined.

In a description of the disclosure later, the above-described symbols are named, defined, and used as follows.

Definition 1

$E(H_S)$: maximum exponent matrix
$V_{i,j}$: maximum exponent matrix element (corresponding to an $(i,j)^{th}$ element of $E(H_S)$)

A parity check matrix for a predetermined LDPC code may be indicated using the above-defined maximum exponent matrix or maximum exponent matrix element.

In a next-generation mobile communication system, there may be a plurality of maximum exponent matrixes defined above in order to guarantee the best performance of a code block having various lengths. For example, there may be M different maximum exponent matrices, which may be expressed as follows.

$$E(H_S)_1, E(H_S)_2, \ldots, E(H_S)_M \quad \text{[Equation 8]}$$

There may be a plurality of maximum exponent matrix elements corresponding thereto, which may be expressed as follows.

$$(V_{i,j})_1, (V_{i,j})_2, \ldots, (V_{i,j})_M \quad \text{[Equation 9]}$$

In [Equation 9], a maximum exponent matrix element $(V_{i,j})_m$ corresponds to (i, j) of a maximum exponent matrix $E(H_S)_m$. Hereinafter, in definition of the parity check matrix for the LDPC code, the above-defined maximum exponent matrix will be used and described. This may be applied to be the same as the expression using the maximum exponent matrix element.

A turbo code-based code block segmentation and CRC attachment method in a document of LTE TS 36.213 is described.

5.1.2 Code Block Segmentation and Code Block CRC Attachment

The input bit sequence to the code block segmentation is denoted by $b_0, b_1, b_2, \ldots, b_{B-1}$, where B>0. If B is larger than the maximum code block size Z, segmentation of the input bit sequence is performed and an additional CRC sequence of L=24 bits is attached to each code block. The maximum code block size is:

Z=6144.

If the number of filler bits F calculated below is not 0, filler bits are added to the beginning of the first block.

Note that if B<40, filler bits are added to the beginning of the code block.

The filler bits shall be set to <NULL> at the input to the encoder.

Total number of code blocks C is determined by:

```
if B ≤ Z
    L = 0
    Number of code blocks: C = 1
    B' = B
else
    L = 24
    Number of code blocks: C = ⌈B /(Z − L)⌉.
    B' = B + C · L
end if
```

The bits output from code block segmentation, for C≠0, are denoted by $c_{r0}, c_{r1}, c_{r2}, c_{r3}, \ldots c_{r(K_r-1)}$, where r is the code block number, and $K_r$ is the number of bits for the code block number r.

Number of bits in each code block (applicable for C≠0 only):

First segmentation size: $K_+$ = minimum K in table 5.1.3-3 such that
$C \cdot K \geq B'$
    if C = 1
        the number of code blocks with length $K_+$ is $C_+ = 1$, $K_- = 0$,
        $C_- = 0$
    else if c > 1
        Second segmentation size: $K_-$ = maximum K in table 5.1.3-3
        such that $K < K_+$
        $\Delta_K = K_+ - K_-$ Number of segments of size $K_-$: $C_- = \left\lfloor \dfrac{C \cdot K_+ - B'}{\Delta_K} \right\rfloor$.

Number of segments of size $K_+$: $C_+ = C - C_-$.
    end if
Number of filler bits: $F = C_- \cdot K_+ + C_- \cdot K_- - B'$
for k = 0 to F − 1                       - Insertion of filler bits
    $c_{0k} =<$ NULL $>$
end for
k = F
s = 0
for r = 0 to C − 1
    if r < $C_-$
        $K_r = K_-$
    else
        $K_r = K_+$
    end if
    while k < $K_r - L$
        $c_{rk} = b_s$
        k = k + 1
        s = s + 1
    end while
    if C > 1
        The sequence $c_{r0}, c_{r1}, c_{r2}, c_{r3}, \ldots, c_{r(K_r-L-1)}$ is used to calculate
        the CRC parity bits $p_{r0}, p_{r1}, p_{r2}, \ldots, p_{r(L-3)}$ according to
        section 5.1.1 with the generator polynomial $g_{CRC24B}$(D). For
        CRC calculation it is assumed that filler bits, if present,
        have the value 0.
        while k < $K_r$
            $c_{rk} = p_{r(k+L-K_r)}$
            k = k + 1
        end while
    end if
    k = 0
end for 5G and next-generation communication systems use the LDPC code in a data channel unlike the LTE system. Even in a situation in which the LDPC code is applied, one transport block may be divided into a plurality of code blocks, and some code blocks thereof may form one code block group. Further, the numbers of code blocks of respective code block groups may be the same as each other or may have different values. Bit-unit interleaving may be applied to an individual code block, a code block group, or a transport block.

Figure 3:
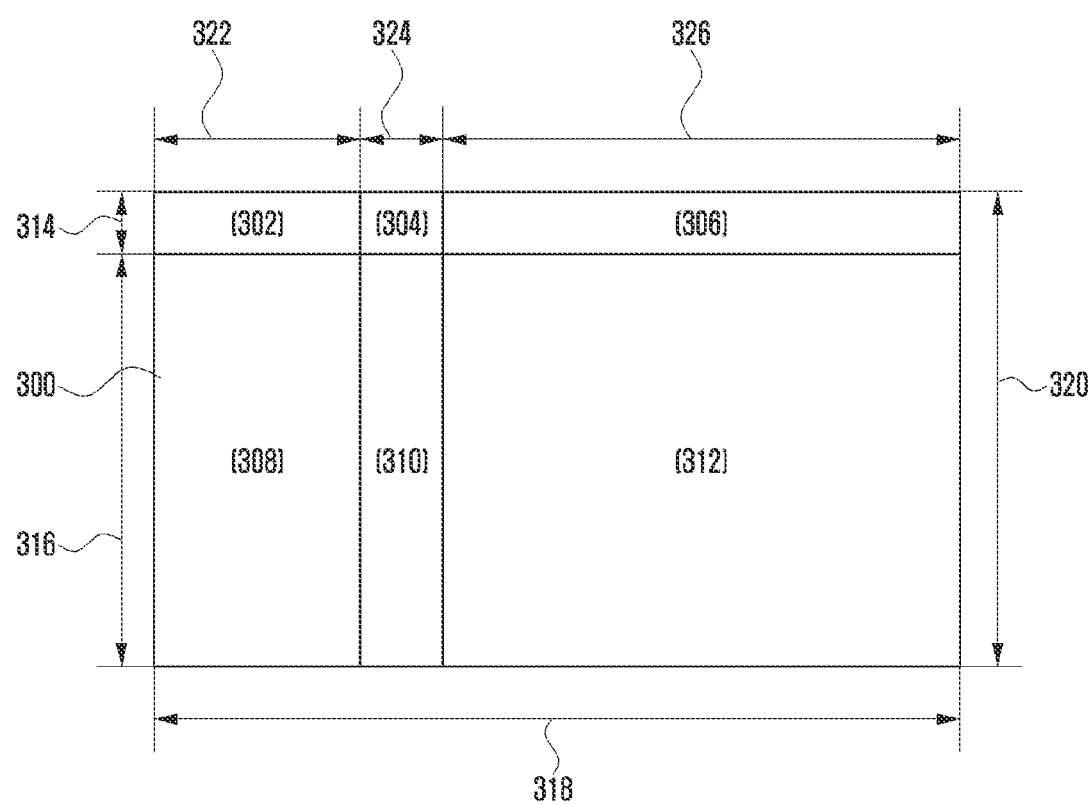
FIG. 3 illustrates the basic structure of a base graph of an LDPC code.

FIG. 3 illustrates a basic structure of a mother matrix (or a base graph) of the LDPC code.

In FIG. 3, two basic structures of a base graph 300 of the LDPC code supporting a data channel coding are basically supported by a next-generation mobile communication system. The first base graph structure of the LDPC code is a matrix structure having a maximum vertical length 320 of 46 and a maximum horizontal length 318 of 68, and the second base graph structure of the LDPC code is a matrix structure having a maximum vertical length 320 of 42 and a maximum horizontal length 318 of 52. The first base graph structure of the LPDC code may support a minimum of 1/3 code rate to a maximum of 8/9 code rate, and the second base graph structure of the LDPC may support a minimum of 1/5 code rate to a maximum of 8/9 code rate.

Basically, the LDPC code may include 6 sub matrix structures. A first sub matrix structure 302 includes system bits. A second sub matrix structure 304 is a square matrix and includes parity bits. A third sub matrix structure 306 is a zero matrix. A fourth sub matrix structure 308 and a fifth sub matrix structure 310 include parity bits. A sixth sub matrix structure 312 is a unit matrix.

In the first base graph structure of the LDPC code, a horizontal length 322 of the first sub matrix 302 has a value of 22 and a vertical length 314 has a value of 4 or 5. Both a horizontal length 324 and a vertical length 314 of the second sub matrix 304 have a value of 4 or 5. A horizontal length 326 of the third sub matrix 306 has a value of 42 or 41 and a vertical length 314 has a value of 4 or 5. A vertical length 316 of the fourth sub matrix 308 has a value of 42 or 41 and a horizontal length 322 has a value of 22. A horizontal length 324 of the fifth sub matrix 310 has a value of 4 or 5 and a vertical length 316 has a value of 42 or 41. Both a horizontal length 326 and a vertical length 316 of the sixth sub matrix 312 have a value of 42 or 31.

In the second base graph structure of the LDPC code, a horizontal length 322 of the first sub matrix 302 has a value of 10 and a vertical length 314 has a value of 7. Both a horizontal length 324 and a vertical length 314 of the second sub matrix 304 have a value of 7. A horizontal length 326 of the third sub matrix 306 has a value of 35 and a vertical length 314 has a value of 7. A vertical length 316 of the fourth sub matrix 308 has a value of 35 and a horizontal length 322 has a value of 10. A horizontal length 324 of the fifth sub matrix 310 has a value of 7 and a vertical length 316 has a value of 35. Both a horizontal length 326 and a vertical length 316 of the sixth sub matrix 312 have a value of 35.

One code block size supportable by the first base graph structure of the LDPC code is 22×Z (Z=a×2j and Z is as shown in [Table 3] below. A maximum size of one supportable code block is 8448 and a minimum size of one supportable code block is 44. For reference, some or all of 272, 304, 336, 368) may be additionally reflected as a candidate of Z in [Table 3]).

TABLE 3

| | | a | | | | | | |
|---|---|---|---|---|---|---|---|---|
| Z | | 2 | 3 | 5 | 7 | 9 | 11 | 13 | 15 |
| j | 0 | 2 | 3 | 5 | 7 | 9 | 11 | 13 | 15 |
| | 1 | 4 | 6 | 10 | 14 | 18 | 22 | 26 | 30 |
| | 2 | 8 | 12 | 20 | 28 | 36 | 44 | 52 | 60 |
| | 3 | 16 | 24 | 40 | 56 | 72 | 88 | 104 | 120 |
| | 4 | 32 | 48 | 80 | 112 | 144 | 176 | 208 | 240 |
| | 5 | 64 | 96 | 160 | 224 | 288 | 352 | | |
| | 6 | 128 | 192 | 320 | | | | | |
| | 7 | 256 | 384 | | | | | | |

In the first base graph structure of the LDPC code, sizes of one supportable code block are as follows.
    44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)

In the above sizes, (5984, 6688, 7392, 8096) may be additionally included.

A total of M maximum exponent matrices $E(H_S)_i^1$ are additionally defined on the basis of the first base graph of the LDPC code (BG#1). In general, M may have a value of 8 or a random natural value, and i has a value from 1 to M. The terminal performs downlink data decoding or uplink data encoding using the matrices $E(H_S)_i^1$. The matrices $E(H_S)_i^1$ have particular element values shifted from the first base graph of the LDPC code (BG#1). That is, the matrices $E(H_S)_i^1$ may have different shifted values.

In the second base graph structure of the LDPC code, one supportable code block size is 10×Z (Z=a×2 and Z is as shown in [Table 4] below. A maximum size of one supportable code block is 2560 (or 3840) and a minimum size of one supportable code block is 20. For reference, some or all of (288, 272, 304, 320, 336, 352, 368, 384) may be additionally reflected as a candidate of Z in [Table 4].

TABLE 4

| | | | | | a | | | | |
|---|---|---|---|---|---|---|---|---|---|
| | Z | 2 | 3 | 5 | 7 | 9 | 11 | 13 | 15 |
| j | 0 | 2 | 3 | 5 | 7 | 9 | 11 | 13 | 15 |
| | 1 | 4 | 6 | 10 | 14 | 18 | 22 | 26 | 30 |
| | 2 | 8 | 12 | 20 | 28 | 36 | 44 | 52 | 60 |
| | 3 | 16 | 24 | 40 | 56 | 72 | 88 | 104 | 120 |
| | 4 | 32 | 48 | 80 | 112 | 144 | 176 | 208 | 240 |
| | 5 | 64 | 96 | 160 | 224 | | | | |
| | 6 | 128 | 192 | | | | | | |
| | 7 | 256 | | | | | | | |

In the second base graph structure of the LDPC code, sizes of one supportable code block are as follows.

20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680)

In the above sizes, (2880, 3200, 3520, 3840, 2720, 3040, 3360, 3680) are values that may be additionally included.

A total of M maximum exponent matrices $E(H_S)_i^2$ are additionally defined on the basis of the second base graph of the LDPC code (BG#2). In general, M may have a value of 8 or a random natural value, and i has a value from 1 to M. The terminal performs downlink data decoding or uplink data encoding using the matrices $E(H_S)_i^2$. The matrices $E(H_S)_i^2$ have particular element values shifted from the second base graph of the LDPC code (BG#2). That is, the matrices $E(H_S)_i^2$ may have different shifted values.

As described above, the two types of base graphs are provided in the next-generation mobile communication system. Accordingly, particular terminals may support only the first base graph or the second base graph, or there may be terminals supporting both the two base graphs. They are listed as shown in [Table 5] below.

TABLE 5

| Terminal type | Supportable operation |
|---|---|
| Type 1 | Support only first base graph or support maximum exponent matrix $E(H_S)^1_i$ |
| Type 2 | Support only second base graph or support maximum exponent matrix $E(H_S)^2_i$ |
| Type 3 | Support both two base graphs or support maximum exponent matrices $E(H_S)^1_i$ and $E(H_S)^2_i$ |

When receiving downlink data information through downlink control information from the eNB, the terminal supporting type 1 determines that a base graph applied to a transport block including the downlink data information is always the first base graph and applies the maximum exponent matrix $E(H_S)_i^1$ to data encoding or decoding. When receiving downlink data information through downlink control information from the eNB, the terminal supporting type 2 determines that a base graph applied to a transport block including the downlink data information is always the second base graph and applies the maximum exponent matrix $E(H_S)_i^2$ to data encoding or decoding.

When receiving downlink data information through downlink control information from the eNB, the terminal supporting type 3 receives in advance a configuration of a base graph applied to a transport block including the downlink data information from the eNB through higher layer signaling such as SIB, RRC, or MAC CE or through downlink control information transmitted in a UE group-common, UE (cell)-common or UE-specific control channel. The downlink control information may be included together with transport block scheduling information or alone.

Embodiment 1-1

Figure 4:
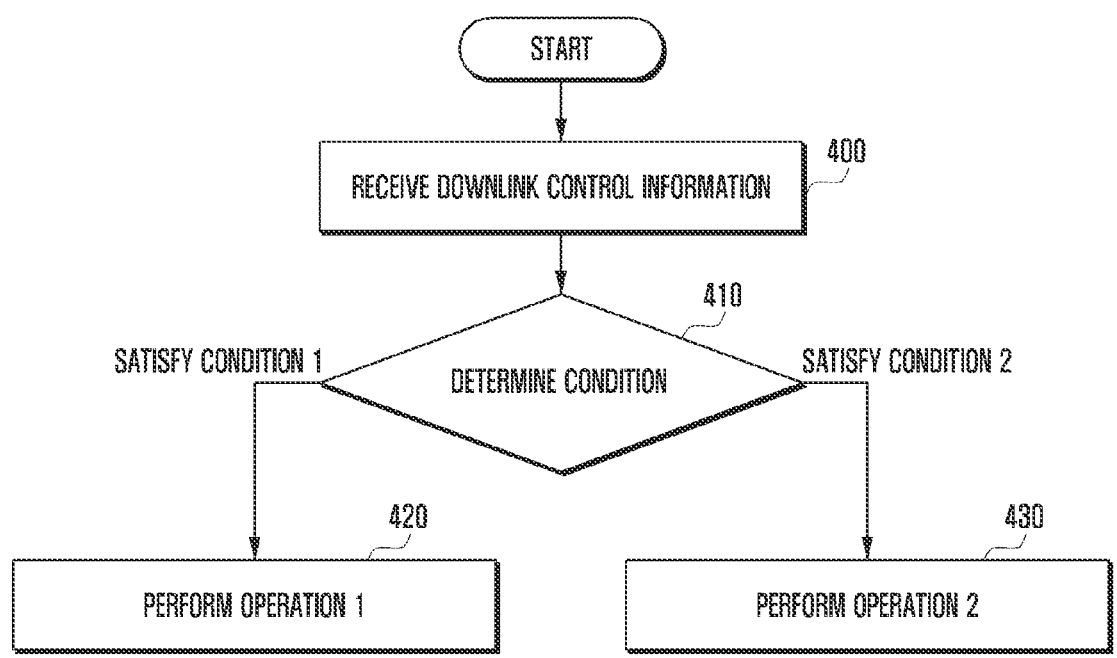
FIG. 4 is a block diagram illustrating an example of a reception operation of a terminal according to embodiment 1.

FIG. 4 is a block diagram illustrating a reception process of the terminal according to an embodiment of the disclosure.

In FIG. 4, the terminal receives downlink control information through UE (cell) common downlink control channel, a UE group-common downlink control channel, or a UE-specific downlink control channel in step 400.

The terminal determines whether the received downlink control information corresponds to one or a combination of two or more of the following conditions in step 410.
- A. An RATI scrambled in CRC of the downlink control information
- B. Size of a transport block included in the downlink control information
- C. A base graph indicator included in the downlink control information
- D. A Scheduling-related value included in the downlink control information If the RNTI scrambled in the CRC of the downlink control information, which is condition A, is an RNTI (for example, a semi-persistent scheduling (SPS)-RNTI) or a cell-RNTI (C-RNTI)) other than a random access (RA)-RNTI, a paging-RNTI (P-RNTI), a system information (SI)-RNTI, a single cell (SC)-RNTI, a group-RNTI (G-RNTI), the terminal determines that it corresponds to condition 1 and performs operation 1 in step 420.

If the RNTI scrambled in the CRC of the downlink control information, which is condition A, is an RA-RNTI, a P-RNTI, an SI-RNTI, an SC-RNTI, or a G-RNTI, the terminal determines that it corresponds to condition 2 and performs operation 2 in step 430.

If the size of the transport block included in the downlink control information, which is condition B, and the CRC is larger than or equal to a predetermined threshold value (Δ1), the terminal determines that it corresponds to condition 1 and performs operation 1 in step 420.

If the size of the transport block included in the downlink control information, which is condition B, and the CRC is equal to or smaller than a predetermined threshold value (Δ2), the terminal determines that it corresponds to condition 2 and performs operation 2 in step 430.

The threshold value (Δ1) or the threshold value (Δ2) may be a value fixed to 2560 (or 3840, 960, 1040, 1120, 170, 640, or a predetermined value). Further, the threshold value (Δ1) or the threshold value (Δ2) may be the same value or different values.

Alternatively, the threshold value (Δ1) or the threshold value (Δ2) may be a value configured in advance through higher layer signaling such as SIB, RRC, or MAC CE or a value configured through downlink control information of a UE group-common, UE-common, or UE-specific control channel. At this time, before the threshold value (Δ) is configured, a value fixed to 2560 (or 3840, 960, 1040, 1120, 170, 640, or other predetermined values) may be used as a default threshold value (Δ). A time point at which the threshold value (Δ1) or the threshold value (Δ2) is configured means a time point before the terminal scrambles CRC of downlink control information with an RA-RANTI, a P-RNTI, an SI-RNTI, an SC-RNTI, or a G-RNTI.

Alternatively, if the size of the transport block included in the downlink control information, which is condition B, and the CRC is smaller than 2560 (or 3840) (and larger than 160 or 640) and if a minimum code block length ($K_{min}$) among code block lengths (K) supportable by the first base graph that satisfies K>(transport block size+CRC size) and code block lengths (K) supportable by the second base graph belongs to the first base graph, the terminal determines that it corresponds to condition 1 and performs operation 1 in step 420.

Alternatively, if the size of the transport block included in the downlink control information, which is condition B, and the CRC is smaller than 2560 (or 3840) (and larger than 160 or 640) and if a minimum code block length K among code block lengths supportable by the first base graph that satisfies K>(transport block size+CRC size) and code block lengths (K) supportable by the second base graph belongs to the second base graph, the terminal determines that it corresponds to condition 2 and performs operation 2 in step 430.

This may be expressed using the following equation.

$$(TB+CRC) \leq K \leq V_2 \text{ where } K \in K^1 \text{ or } K \in K^2$$

$$K^* = \min(K)$$

If $K^* \in K^1$, satisfy condition 1 and perform operation 1 in step 420

If $K^* \in K^2$, satisfy condition 2 and perform operation 2 in step 430

K is a code block length, K* is a selected code block length, and TB is a transport block size. Further, the CRC is a CRC size, $K^1$ is a set of code block lengths supportable by the first base graph, and $K^2$ is a set of code block lengths supportable by the second base graph.

Alternatively, they may be expressed using the following equation.

$$V1 = (TB+CRC) \leq K \leq V2 \text{ where } K \in K1 \text{ or } K \in K2$$

$$K^* = \min(K)$$

If $K^* \in K^1$, satisfy condition 1 and perform operation 1 in step 420

If $K^* \in K^2$, satisfy condition 2 and perform operation 2 in step 430

K is a code block length, K* is a selected code block length, and TB is a transport block size. Further, the CRC is a CRC size, $K^1$ is a set of code block lengths supportable by the first base graph, and $K^2$ is a set of code block lengths supportable by the second base graph.

$K^1$ is a set of code block lengths supportable by the first base graph (or the maximum exponent matrix $E(H_S)_i^1$), and the type of sets may be one or a combination of two or more of the following values. $V_1$ may be 160, 640, or another value. $V_2$ may be 2560, 3840, 960, 1040, 1120, or another value.

Alternatively, if TB+CRC is smaller than $V_1$ in the above equation, decoding or encoding can be performed by applying one of the maximum exponent matrices $E(H_S)_i^2$. If TB+CRC is larger than $V_2$ in the above equation, decoding or encoding can be performed by applying one of the maximum exponent matrices $E(H_S)_i^1$.

$K^1$ is a set of code block lengths supportable by the first base graph (or the maximum exponent matrix $E(H_S)_i^1$), and the type of sets may be one or a combination of two or more of the following values.

1. The case in which K is equal to or smaller than 2560
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464
2. The case in which K is equal to or smaller than 3840
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464, 2640, 2816, 3168, 3520
3. The case in which K is equal to or smaller than 960
   44, 66, 88, 132, 154, 176, 198, 242, 264, 286, 308, 330, 352, 296, 484, 528, 572, 616, 660, 704, 792
4. The case in which K is equal to or smaller than 1040
   44, 66, 88, 132, 154, 176, 198, 242, 264, 286, 308, 330, 352, 296, 484, 528, 572, 616, 660, 704, 792, 968
5. The case in which K is equal to or smaller than 1120
   44, 66, 88, 132, 154, 176, 198, 242, 264, 286, 308, 330, 352, 296, 484, 528, 572, 616, 660, 704, 792, 968, 1056

If the values in the table are equal to or smaller than M, all or some of the values can be generally used while being omitted from the table. 160, 640, or another value may be selected as M.

$K^2$ is a set of code block lengths supportable by the second base graph (or the maximum exponent matrix $E(H_S)_i^2$), and the type of sets may be one or a combination of two or more of the following values.

1. The case in which K is equal to or smaller than 2560
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560
2. The case in which K is equal to or smaller than 3840
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, (2720, 2880, 3040, 3200, 3360, 3520, 3680, 3840)
3. The case in which K is equal to or smaller than 960
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960
4. The case in which K is equal to or smaller than 1040
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040
5. The case in which K is equal to or smaller than 1120
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120

If the base graph indicator included in the downlink control information, which is condition C, indicates a value of 0 (or 1), the terminal determines that it satisfies condition 1 and performs operation 1 in step 420.

If the base graph indicator included in the downlink control information, which is condition C, indicates a value of 1 (or 0), the terminal determines that it satisfies condition 2 and performs operation 2 in step 430.

If MCS, RV, NDI, or frequency or time resource allocation values among the scheduling-related values included in the downlink control information, which are condition D, indicate specific information, the terminal determines that it corresponds to condition 1 and performs operation 1 in step 420.

If MCS, RV, NDI, or frequency or time resource allocation values among the scheduling-related values included in the downlink control information, which are condition D, indicate specific information, the terminal determines that it corresponds to condition 2 and performs operation 2 in step 430.

If the terminal performs operation 1, the terminal performs one or a combination of two or more of operations.

1. The terminal attempts decoding on a transport block indicated by the downlink control information on the basis of code block lengths supportable by the first base graph (or the maximum exponent matrix $E(H_S)_i^1$).
2. The terminal attempts decoding on a transport block indicated by the downlink control information on the basis of the following table of supportable code blocks.
   44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)
3. Among the following available code block sets, one or more combinations thereof correspond to code blocks which the terminal encodes or decodes using $E(H_S)_1^1$. For the corresponding code blocks, the terminal at least attempts decoding on a transport block indicated by the downlink control information on the basis of the matrix $E(H_S)_1^1$ supported by the first base graph.
   A. 44, 88, 176, 352, 704, 1408, 2816, 5632
   B. 44, 66, 110, 154, 198, 242, 286, 330
   C. 44, 66, 154, 198, 242, 286, 330
4. Among the following available code block sets, one or more combinations) thereof correspond to code blocks which the terminal encodes or decodes using $E(H_S)_2^1$. For the corresponding code blocks, the terminal at least attempts decoding on a transport block indicated by the downlink control information on the basis of the matrix $E(H_S)_2^1$ supported by the first base graph.
   A. 66, 132, 264, 528, 1056, 2112, 4224, 8448
   B. 88, 132, 220, 308, 396, 484, 572, 660
   C. 88, 132, 308, 396, 484, 572, 660
5. Among the following available code block sets, one or more combinations thereof correspond to code blocks which the terminal encodes or decodes using $E(H_S)_3^1$. For the corresponding code blocks, the terminal at least attempts decoding on a transport block indicated by the downlink control information on the basis of the matrix $E(H_S)_3^1$ supported by the first base graph.
   A. 110, 220, 440, 880, 1760, 3520, 7040
   B. 176, 264, 440, 616, 792, 968, 1144, 1320
   C. 1760, 3520, 7040
   D. 3520, 7040
   E. 7040
   F. 176, 264, 616, 792, 968, 1144, 1320
6. Among the following available code block sets, one or more combinations thereof correspond to code blocks which the terminal encodes or decodes using $E(H_S)_4^1$. For the corresponding code blocks, the terminal at least attempts decoding on a transport block indicated by the downlink control information on the basis of the matrix $E(H_S)_4^1$ supported by the first base graph.
   A. 154, 308, 616, 1232, 2464, 4928
   B. 352, 528, 880, 1232, 1584, 1936, 2288, 2640
   C. 352, 528, 1232, 1584, 1936, 2288, 2640
7. Among the following available code block sets, one or more combinations thereof correspond to code blocks which the terminal encodes or decodes using $E(H_S)_5^1$. For the corresponding code blocks, the terminal at least attempts decoding on a transport block indicated by the downlink control information on the basis of the matrix $E(H_S)_5^1$ supported by the first base graph.
   A. 198, 396, 792, 1584, 3168, 6336
   B. 704, 1056, 1760, 2464, 3168, 3872, 4576, 5280
   C. 704, 1056, 2464, 3168, 3872, 4576, 5280
8. Among the following available code block sets, one or more combinations thereof correspond to code blocks which the terminal encodes or decodes using $E(H_S)_6^1$. For the corresponding code blocks, the terminal at least attempts decoding on a transport block indicated by the downlink control information on the basis of the matrix $E(H_S)_6^1$ supported by the first base graph.
   A. 242, 484, 968, 1936, 3872
   B. 1408, 2112, 3520, 4928, 6336, 7744
   C. 1408, 2112, 4928, 6336, 7744
9. Among the following available code block sets, one or more combinations) thereof correspond to code blocks which the terminal encodes or decodes using $E(H_S)_7^1$. For the corresponding code blocks, the terminal at least attempts decoding on a transport block indicated by the downlink control information on the basis of the matrix $E(H_S)_7^1$ supported by the first base graph.
   A. 286, 572, 1144, 2288, 4576
   B. 2816, 4224, 7040
10. Among the following available code block sets, one or more combinations thereof correspond to code blocks which the terminal encodes or decodes using $E(H_S)_8^1$. For the corresponding code blocks, the terminal at least attempts decoding on a transport block indicated by the downlink control information on the basis of the matrix $E(H_S)_8^1$ supported by the first base graph.
    A. 330, 660, 1320, 2640, 5280
    B. 5632, 8448

If the terminal performs operation 2, the terminal performs one or a combination of two or more of the following operations.

1. The terminal attempts decoding on a transport block indicated by the downlink control information on the basis of code block lengths supportable by the second base graph.
2. The terminal attempts decoding on a transport block indicated by the downlink control information on the basis of the following table of supportable code blocks.
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680)
3. Among the following available code block sets, one or more combinations thereof correspond to code blocks which the terminal encodes or decodes using $E(H_S)_1^2$. For the corresponding code blocks, the terminal at least attempts decoding on a transport block indicated by the downlink control information on the basis of the matrix $E(H_S)_1^2$ supported by the second base graph.

A. 20, 40, 80, 160, 320, 640, 1280
B. 20, 30, 50, 70, 90, 110, 130, 150
4. Among the following available code block sets, one or more combinations thereof correspond to code blocks which the terminal encodes or decodes using $E(H_S)_2^2$. For the corresponding code blocks, the terminal at least attempts decoding on a transport block indicated by the downlink control information on the basis of the matrix $E(H_S)_2^2$ supported by the second base graph.
A. 30, 60, 120, 240, 480, 960, 1920, (3840)
B. 40, 60, 100, 140, 180, 220, 260, 300
5. Among the following available code block sets, one or more combinations thereof correspond to code blocks which the terminal encodes or decodes using $E(H_S)_3^2$. For the corresponding code blocks, the terminal at least attempts decoding on a transport block indicated by the downlink control information on the basis of the matrix $E(H_S)_3^2$ supported by the second base graph.
A. 50, 100, 200, 400, 800, 1600, (3200)
B. 80, 120, 200, 280, 360, 440, 520, 600
6. Among the following available code block sets, one or more combinations thereof correspond to code blocks which the terminal encodes or decodes using $E(H_S)_4^2$. For the corresponding code blocks, the terminal at least attempts decoding on a transport block indicated by the downlink control information on the basis of the matrix $E(H_S)_4^2$ supported by the second base graph.
A. 70, 140, 280, 560, 1120, 2240
B. 160, 240, 400, 560, 720, 880, 1040, 1200
7. Among the following available code block sets, one or more combinations thereof correspond to code blocks which the terminal encodes or decodes using $E(H_S)_5^2$. For the corresponding code blocks, the terminal at least attempts decoding on a transport block indicated by the downlink control information on the basis of the matrix $E(H_S)_5^2$ supported by the second base graph.
A. 90, 180, 360, 720, 1440, (2880)
B. 320, 480, 800, 1120, 1440, 1760, 2080, 2400
8. Among the following available code block sets, one or more combinations thereof correspond to code blocks which the terminal encodes or decodes using $E(H_S)_6^2$. For the corresponding code blocks, the terminal at least attempts decoding on a transport block indicated by the downlink control information on the basis of the matrix $E(H_S)_6^2$ supported by the second base graph.
A. 110, 220, 440, 880, 1760, (3520)
B. 640, 960, 1600, 2240, (2880), (3520) 9. Among the following available code block sets, one or more combinations thereof correspond to code blocks which the terminal encodes or decodes using $E(H_S)_7^2$. For the corresponding code blocks, the terminal at least attempts decoding on a transport block indicated by the downlink control information on the basis of the matrix $E(H_S)_7^2$ supported by the second base graph.
A. 130, 260, 520, 1040, 2080
B. 1280, 1920, (3200)
10. Among the following available code block sets, one or more combinations thereof correspond to code blocks which the terminal encodes or decodes using $E(H_S)_8^2$. For the corresponding code blocks, the terminal at least attempts decoding on a transport block indicated by the downlink control information on the basis of the matrix $E(H_S)_8^2$ supported by the second base graph.
A. 150, 300, 600, 1200, 2400
B. 2560, (3840)
In the disclosure, a number in brackets means that the corresponding value is included or not.

Embodiment 1-2

Figure 5:
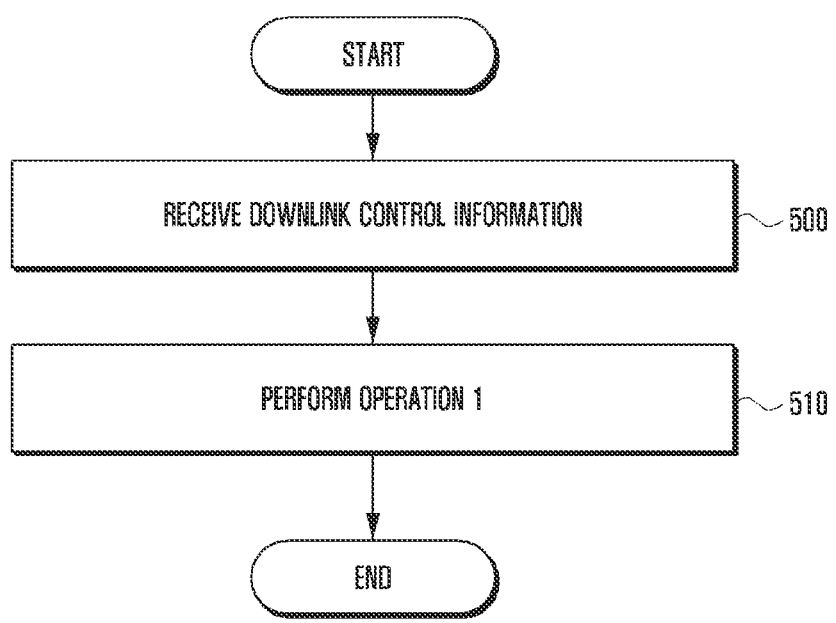
FIG. 5 is a block diagram illustrating an example of another reception operation of the terminal according to embodiment 1.

FIG. 5 is a block diagram illustrating a reception operation of the terminal according to embodiment 1-2.

In FIG. 5, the terminal receives downlink control information through UE (cell) common downlink control channel, a UE group-common downlink control channel, or a UE-specific downlink control channel in step 500.

The terminal performs decoding of a transport block in a downlink data channel allocated through reception of the downlink control information according to one or a combination of two or more of the following operations in step 510.

1. The terminal encodes or decodes the corresponding transport block by) applying one of the maximum exponent matrices $E(H_S)_i^1$ in consideration of the following supportable code block lengths.
   44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)
2. The terminal encodes or decodes the corresponding transport block by applying one of the maximum exponent matrices $E(H_S)_i^2$ in consideration of the following supportable code block lengths.
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, (2880, 3200, 3520, 3840, 2720, 3040, 3360, 3680)
3. The terminal encodes or decodes the corresponding transport block by) applying one of the maximum exponent matrices $E(H_S)_i^1$ or $E(H_S)_i^2$ in consideration of the following supportable code block lengths.
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, 2640, 2816, 3168, 3520, 3872, 4224, 4576, 4928, 5280, 5632, 6336, 7040, 7744, 8448, (5984, 6688, 7392, 8096)
4. The terminal encodes or decodes the corresponding transport block by applying one of the maximum exponent matrices $E(H_S)_i^1$ or $E(H_S)_i^2$ in consideration of the following supportable code block lengths.
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, (2880, 3200, 3520, 3840, 2720, 3040, 3360, 3680), 3872, 4224, 4576, 4928, 5280, 5632, 6336, 7040, 7744, 8448, (5984, 6688, 7392, 8096)
5. The terminal encodes or decodes the corresponding transport block by applying one of the maximum exponent matrices $E(H_S)_i^1$ or $E(H_S)_i^2$ in consideration of the following supportable code block lengths.
   20, 30, 40, 44, 50, 60, 66, 70, 80, 88, 90, 100, 110, 120, 130, 132, 140, 150, 154, 160, 176, 180, 198, 200, 220, 240, 242, 260, 264, 280, 286, 296, 300, 308, 320, 330, 352, 360, 400, 440, 480, 484, 520, 528, 560, 572, 600, 616, 640, 660, 704, 720, 792, 800, 880, 960, 968, 1040, 1056, 1120, 1144, 1200, 1232, 1280, 1320, 1408, 1440, 1584, 1600, 1760, 1920, 1936, 2080, 2112, 2240, 2288, 2400, 2464, 2560, 2640, 2816, 3168, 3520, 3872, 4224, 4576, 4928, 5280, 5632, 6336, 7040, 7744, 8448, (5984, 6688, 7392, 8096)

6. The terminal encodes or decodes the corresponding transport block by applying one of the maximum exponent matrices $E(H_S)_i^1$ or $E(H_S)_i^2$ in consideration of the following supportable code block lengths.

20, 30, 40, 44, 50, 60, 66, 70, 80, 88, 90, 100, 110, 120, 130, 132, 140, 150, 154, 160, 176, 180, 198, 200, 220, 240, 242, 260, 264, 280, 286, 296, 300, 308, 320, 330, 352, 360, 400, 440, 480, 484, 520, 528, 560, 572, 600, 616, 640, 660, 704, 720, 792, 800, 880, 960, 968, 1040, 1056, 1120, 1144, 1200, 1232, 1280, 1320, 1408, 1440, 1584, 1600, 1760, 1920, 1936, 2080, 2112, 2240, 2288, 2400, 2464, 2560, (2720, 2816, 2880, 3040, 3168, 3200, 3360, 3520, 3680, 3840), 3872, 4224, 4576, 4928, 5280, 5632, 6336, 7040, 7744, 8448, (5984, 6688, 7392, 8096)

7. If the applicable code block length is one of the following values, the terminal performs encoding or decoding using the first base graph by applying of the maximum exponent matrices $E(H_S)_i^1$.

110, 220, 440, 880, 1760, (3520)

8. In the case of retransmission, the terminal performs encoding and decoding by applying one of the base graph-based $E(H_S)_i^1$ or $E(H_S)_i^2$ configured in initial transmission and accordingly applying one of the maximum exponent matrices $E(H_S)_i^1$ or $E(H_S)_i^2$.

If the values in the table are equal to or smaller than M, all or some of the values can be generally used while being omitted from the table. 160, 640, or another value may be selected as M.

In the disclosure, values in brackets shown in a table are values that may be entirely or partially included in the table or may not be partially included therein.

A process of decoding the transport block of the downlink data channel by the UE described in the disclosure can be also applied to a process of encoding a transport block of an uplink data channel.

An encoding and decoding operation of the UE described in the disclosure can be also applied to an encoding and decoding operation of the eNB.

Embodiment 2

Embodiment 2 of the disclosure provides a method of segmenting a transport block into code blocks.

Figure 6:
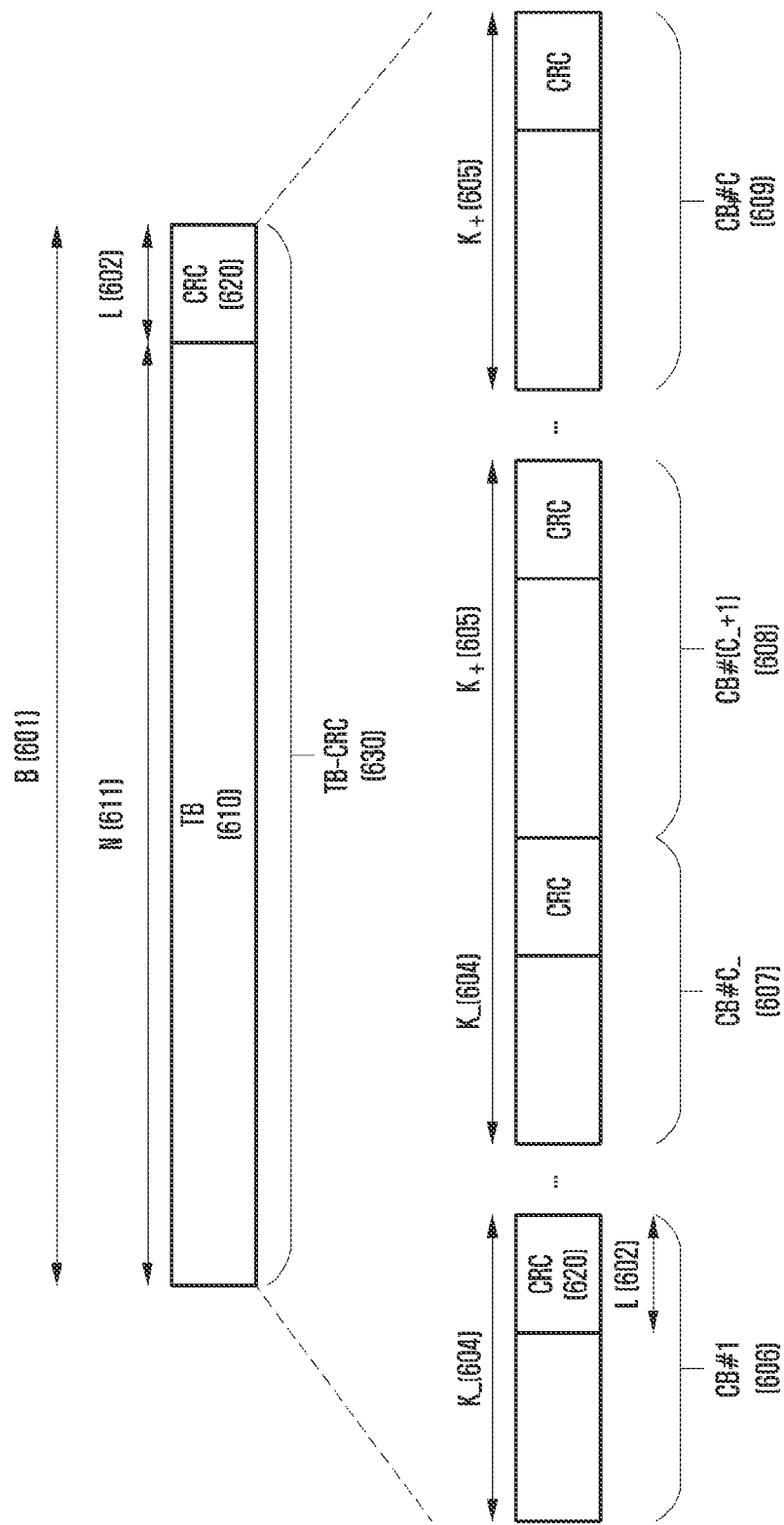
FIG. 6 illustrates an example of segmenting a transport block into code blocks according to embodiment 2.

FIG. 6 illustrates the method of segmenting the transport block into code blocks according to embodiment 2 of the disclosure. In FIG. 6, a transport block 610 having a length N 611 is illustrated, and a CRC 620 having a length L 602 may be inserted and thus a transport block 630 (TC-CRC), into which the CRC is inserted, having a total length of B 601 may be configured.

A length of the CRC inserted into a transmitted TB used for determining whether TB decoding is successful after the TB decoding is L, and L may have at least two available values. That is, if the transport block is segmented into two or more code blocks and transmitted, a long CRC may be used. On the other hand, if the transport block is segmented into one code block and transmitted, a short CRC may be used.

If the LDPC code is used for encoding in the mobile communication system, the LDPC code itself has a parity check function and thus somewhat may have a function of determining whether decoding is successful without CRC insertion. If the LDPC code is used and it is desired to acquire an additional decoding success determination level in a specific mobile communication system, a technology for determining decoding is finally successful in addition to insertion of the parity check function of the LDPC code may be used, and thus an error rate level of the determination about whether decoding is successful, desired by the system, can be obtained. For example, if an error rate of determination about whether decoding is successful, required by the system, is $10^{-6}$ and an error rate of determination acquired by the parity check function of the LDPC code is $10^{-3}$, the final system determination error rate of $10^{-6}$ may be achieved by additionally inserting the CRC having the determination error rate of $10^{-3}$.

In general, as the length of the CRC is longer, an error rate of determination about whether decoding is successful becomes lower. If the transport block is segmented into two or more code blocks and transmitted, the TB itself is configured through concatenation of LDPC codes and thus cannot use a parity check function of the LDPC code. On the other hand, if the transport block includes one code block, the parity check function of the LDPC code may be used. Accordingly, in a specific system, the TB can be used after a long CRC or a short CRC is inserted into the TB according to the number of code blocks within the transport block. In embodiments of the disclosure, it is assumed that a long length $L_+$ or a short length $L_-$ may be used as the length L of the CRC inserted into the TB according to whether the TB is segmented into two or more code blocks. A value available for $L_+$ may be 24, which is used in the LTE system, and any length shorter than 24 may be used for $L_-$ and 16, which is used by the control channel of the LTE system, may be reused. However, in embodiments of the disclosure, $L_-$ is not limited to 16.

Whether a specific TB is segmented into a plurality of code blocks is determined according to whether the given TB can be transmitted using one code block, so that the determination may be performed as follows:

If $N+L_-$ is equal to or smaller than the largest available CB length, the TB is transmitted using one code block (If $(N+L_-) <= K_{max}$, then one CB is used)

If $N+L_-$ is larger than the largest available CB length, the TB is segmented into a plurality of code blocks and transmitted (If $(N+L_-) > K_{max}$, then one CB is segmented)

$K_{max}$ indicates the largest code block size among available code block sizes.

Hereinafter, in the disclosure, it is assumed that $L_+$ is used for the length of the CRC included in the TB to indicate a segmentation method when the TB-CRC is segmented into a plurality of code blocks and transmitted. That is, whether to segment the TB by the eNB and the terminal may be determined on the basis of $N+L_-$, but if it is determined to segment the same, the segmentation is performed on the basis of $B=(N+L_+)$.

FIG. 6 illustrates an example in which the TB-CRC 630 having the length $B$ ($=N+L_+$) is segmented into a total of C ($=C_+ + C_-$) CBs 606, 607, 608, and 609. The segmented C code blocks may include a total of $C_-$ CBs from CB #1 606 to CB #M 607 (where M may be $C_-$) having a code block size $K_-$ 604 and a total of $C_+$ CBs from CB #(M+1) 608 to CB #C 609 having a code block size $K_+$ 605. In the example of FIG. 6, one transport block may be segmented into a plurality of code blocks having various code block sizes. The CRC 620 having a length L 602 may be additionally inserted into each code block. The length L of the CRC inserted into the CBs 606, 607, 608, and 609 may be different from L of the CRC inserted into the TB 630.

Further, the CRC inserted into the CB may be different from the CRC inserted into the TB.

Figure 7:
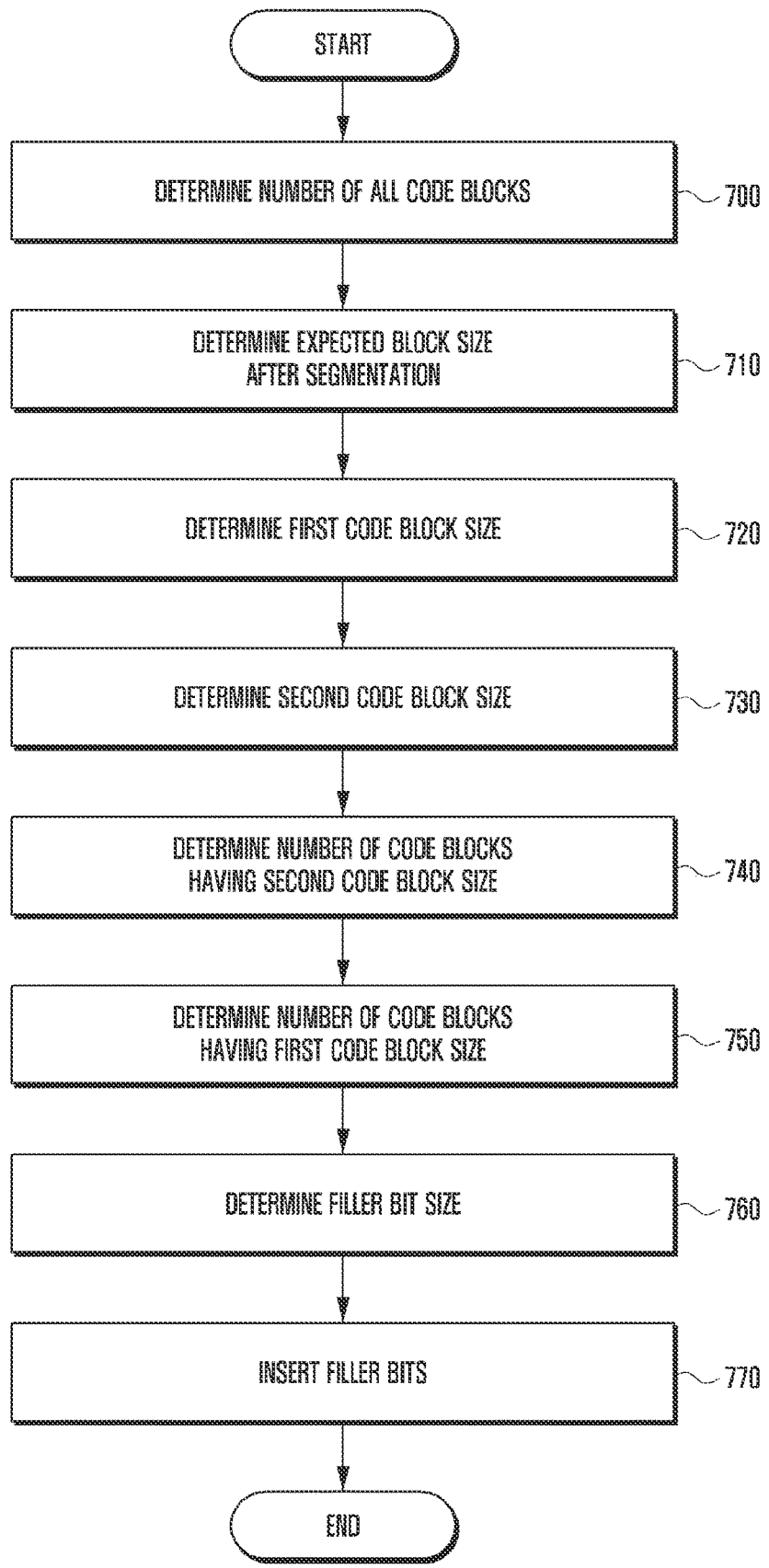
FIG. 7 illustrates a method of segmenting a transport block according to embodiment 2.

FIG. 7 illustrates a method of segmenting a transport block according to embodiment 2 of the disclosure. Referring to FIG. 7, embodiment 2 of the disclosure may include the following steps.

Step 700: determine the number (C) of all code blocks
Step 710: determine an expected size (B') after segmentation into the code blocks
Step 720: determine a first code block size ($K_+$)
Step 730: determine a second code block size ($K_-$)
Step 740: determine the number ($C_-$) of code blocks having the second code block size ($K_-$)
Step 750: determine the number ($C_+$) of code blocks having the first code block size ($K_+$)
Step 760: determine the number of filler bits
Step 770: insert filler bits Hereinafter, each step will be described in detail.

In step 700, the number C of all code blocks segmented from one transport block may be determined, which may be obtained through a method such as [Equation 10] below.

$$C = (B/K_{max} - L))  \quad \text{[Equation 10]}$$

In [Equation 10] above, $K_{max}$ is the largest code block size among available code block sizes. (x) operation is a ceiling operation for x and indicates a function corresponding to the smallest integer larger than or equal to a real number x. Through [Equation 10] above, the number of code blocks generated after segmentation of the transport block may be minimized. $K_{max}$ may have a value, for example, 8448.

In step 710, an expected size B' of all blocks after segmentation into the code blocks may be determined on the basis of the number of code blocks determined in step 700. This may follow, for example, [Equation 11] below.

$$B' = B + C \cdot L \quad \text{[Equation 11]}$$

According to [Equation 11] above, the expected size B' after the segmentation into the code blocks may be determined by the size B, obtained by adding the transport block before the segmentation into the code blocks and the CRC for the transport block, and the size C·L of all $CRC_S$ added after the segmentation into the code blocks.

In step 720, a first code block size ($K_+$) may be determined. The first code block size may be determined to be the smallest value larger than B'/C. This may be indicated by [Equation 12] below.

$$K_+ = \text{minimum } K \text{ s.t. } C \cdot K \geq B' \quad \text{[Equation 12]}$$

Through [Equation 12] above, the first code block size closest to the whole length B' after the segmentation may be selected.

In step 730, a second code block size $K_-$ may be determined. The second code block size may be determined to be the smallest value larger than B'/C. This may be indicated by [Equation 13] below.

$$K_- = \text{maximum } K \text{ s.t. } K < K_+ \text{ and } E(H_S^{(K)}) = E(H_S^{(K_+)}) \quad \text{[Equation 13]}$$

In [Equation 13] above, $E(H_S^{(K)})$ is defined as a maximum exponent matrix of a parity check matrix for a code block having a code block length K. In determination of the second code block size through [Equation 12] above, the largest value among code block sizes smaller than the first code block size may be selected. In determination of the second code block size through the condition $E(H_S^{(K)}) = E(H_S^{(K_+)})$ of [Equation 13] above, the sameness between maximum exponent matrices of the parity check matrix for code blocks having the first code block size and the second code block size may be guaranteed. In a more detailed example, different maximum exponent matrices of parity check matrices may be defined according to supportable code block sizes. If a set of all supportable code block sizes is {K1, K2, ..., KN} and a set of supportable maximum exponent matrices is {E(HS)1, E(HS)2, ..., E(HS)}, [Equation 14] below may be satisfied.

$$E(H^{(K_n)}) \in \{E(H_S)_1, E(H_S)_2, \ldots E(H_S)_M\} \text{ for } 1 \leq n \leq N \quad \text{[Equation 14]}$$

Accordingly, a set of code block sizes having the same maximum exponent matrix may be defined through [Equation 15] below.

$$S_1 = \{K_n \text{ for } 1 \leq n \leq N | E(H_S^{(K_n)}) = E(H_S)_1\} \quad \text{[Equation 15]}$$
$$S_2 = \{K_n \text{ for } 1 \leq n \leq N | E(H_S^{(K_n)}) = E(H_S)_2\}$$
$$\vdots$$
$$S_M = \{K_n \text{ for } 1 \leq n \leq N | E(H_S^{(K_n)}) = E(H_S)_M\}$$

In [Equation 15] above, $S_m$ may be defined as a set of code block sizes having exponent matrices $E(H)_m$ of the parity check matrix. [Equation 13] above is described below with reference to [Equation 15] above. If it is assumed that a maximum exponent matrix for the code block having the first code block size determined through [Equation 12] is $E(H^{(K_+)}) = E(H)_m$, the first code block may be an element belonging to $S_m$ in [Equation 15] above. According to [Equation 13] above, the second code block size may be determined as the largest K value smaller than the first code block size among elements of $S_m$ in [Equation 15] above. [Equation 16] may be derived from [Equation 13] using [Equation 15].

$$K_- = \text{maximum } K \text{ s.t. } K < K_+ \text{ and } K \in S^{(K_+)} \quad \text{[Equation 16]}$$

In [Equation 16] above, $S^{(K_+)}$ may be defined as a set of predetermined code block sizes including the first code block size. The set of the code block sizes may be defined as a set of code block sizes having the same exponent matrix through a method such as [Equation 15] above. According to [Equation 16], in determination of the second code block size, an operation for selecting one of the elements within the set of code block sizes, which is the same as the first code block size, may be performed.

Hereinafter, an example of a set of code block sizes having the same exponent matrix described above will be provided. A set of all supportable code block sizes may be as follows.

44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)

(5984, 6688, 7392, 8096) may be values that may be additionally included. A set of supportable maximum exponent matrices may be as follows.

{E(HS)1, E(HS)2, E(HS)3, E(HS)4, E(HS)5, E(HS)6, E(HS)7, E(HS)8}

A set of code block sizes having exponent matrices of the same parity check matrix may be as follows.

$$S_1 = \{K_n \text{ for } 1 \leq n \leq N | E(H_S^{(K_n)}) = E(H_S)_1\}$$

$$S_2 = \{K_n \text{ for } 1 \leq n \leq N | E(H_S^{(K_n)}) = E(H_S)_2\}$$

$$S_3 = \{K_n \text{ for } 1 \leq n \leq N | E(H_S^{(K_n)}) = E(H_S)_3\}$$

$S_4=\{K_n \text{ for } 1\leq n\leq N|E(H_S^{(Kn)})=E(H_S)_4\}$ $S_5=\{K_n \text{ for } 1\leq n\leq N|E(H_S^{(Kn)})=E(H_S)_5\}$ $S_6=\{K_n \text{ for } 1\leq n\leq N|E(H_S^{(Kn)})=E(H_S)_6\}$ $S_7=\{K_n \text{ for } 1\leq n\leq N|E(H_S^{(Kn)})=E(H_S)_7\}$ $S_8=\{K_n \text{ for } 1\leq n\leq N|E(H_S^{(Kn)})=E(H_S)_8\}$ A set of code block sizes that satisfy the above conditions may be as follows.

$S_1$={44, 88, 176, 352, 704, 1408, 2861, 5632}
$S_2$={66, 132, 264, 528, 1056, 2112, 4224, 8448}
$S_3$={110, 220, 440, 880, 1760, 3520, 7040}
$S_4$={154, 308, 616, 1232, 2464, 4928}
$S_5$={198, 396, 792, 1584, 3168, 6336}
$S_6$={242, 484, 968, 1936, 3872, 7744}
$S_7$={286, 572, 1144, 2288, 4576}
$S_8$={330, 660, 1320, 2640, 5280}

In step 740, the number $C_-$ of code blocks having the second code block size $K_-$ may be determined. For example, the number $C_-$ of code blocks may follow [Equation 17].

$$C_- = \left\lfloor \frac{C \cdot K_+ - B'}{\Delta_K} \right\rfloor \text{ where } \Delta_K = K_+ - K_- \quad \text{[Equation 17]}$$

In [Equation 17], *x+ operation is a floor operation and indicates a function corresponding to the largest integer equal to or smaller than a real number x.

Subsequently, in step 750, the number $C_+$ of code blocks having the first code block size $K_+$ may be determined. For example, the number of code blocks may follow [Equation 18] below.

$$C_+=C-C_- \quad \text{[Equation 18]}$$

In methods such as step 740 and step 750 in which the number of code blocks having the second code block size and the number of code blocks having the first code block size are determined, the number of code blocks having the first code block size may be maximized and the number of code blocks having the second code block size may be minimized through [Equation 17] and [Equation 18].

In step 760, the number of filler bits may be determined. The filler bits are bits additionally inserted when the block size after segmentation into final code blocks determined through steps 700 to 750 is larger than the expected block size B' after segmentation into code blocks determined in step 710. This may be indicated by, for example, [Equation 19] below.

$$F=C_+ \cdot K_+ + C_- \cdot K_- - B' \quad \text{[Equation 19]}$$

In step 770, F filler bits determined in step 707 may be inserted into a specific code block. A method of inserting the filler bits may follow the following embodiments.

Embodiment 2-1

In embodiment 2-1 of the disclosure, in insertion of filler bits into a specific code block during segmentation of a transport block into code blocks, all filler bits having the size of F may be inserted into one specific code block. The specific code block may be, for example, a first code block among code blocks generated after the segmentation into the code blocks.

Embodiment 2-2

In embodiment 2-2 of the disclosure, in insertion of filler bits into a specific code block during segmentation of a transport block into code blocks, filler bits having the size of F may be uniformly distributed and inserted into all code blocks. More specifically, filler bits having a first filler bit size may be inserted into first N code blocks among all C code blocks, and filler bits having a second filler bit size may be inserted into the remaining M code blocks. For example, N, M, the first filler bit size $F_+$, and the second filler bit size $F_-$ may be determined through [Equation 20] below.

$$N=F \bmod C, M=C-N, F_+=(F/C), F_-=F_+-1 \quad \text{[Equation 20]}$$

[Equation 20] above may minimize a difference between the first filer bit size and the second filler bit size to be 1. Accordingly, this has an advantage of guaranteeing the most uniform filler bit insertion.

Embodiment 2-3

In embodiment 2-3 of the disclosure, in insertion of filler bits into a specific code block during segmentation of a transport block into code blocks, F filler bits may be uniformly distributed and inserted into all code blocks having a first code block size. More specifically, filler bits having a first code block size $F_+$ may be inserted into first $N_+$ code blocks among all $C_+$ code blocks having the first code block size, and filler bits having a second filler bit size $F_-$ may be inserted into the remaining $M_+$ code blocks. For example, $N_+$, $M_+$, the first filler bit size $F_+$, and the second filler bit size $F_-$ may be determined through [Equation 21] below.

$$N_+=F \bmod C_+, M_+=C_+-N_+, F_+=(F/C_+), F_-=F_+-1 \quad \text{[Equation 21]}$$

Embodiment 2-4

In embodiment 2-4 of the disclosure, in insertion of filler bits into a specific code block during segmentation of a transport block into code blocks, filler bits having the size of F may be uniformly distributed and inserted into all code blocks having a second code block size. More specifically, filler bits having a first code block size $F_+$ may be inserted into first $N_-$ code blocks among all $C_-$ code blocks having the second code block size, and filler bits having a second filler bit size $F_-$ may be inserted into the remaining $M_-$ code blocks. For example, $N_-$, $M_-$, the first filler bit size $F_+$, and the second filler bit size $F_-$ may be determined through [Equation 22] below.

$$N_-=F \bmod C_-, M_-=C_--N_-, F_+=(F/C_-), F_-=F_+-1 \quad \text{[Equation 22]}$$

Embodiment 2-5

In embodiment 2-5 of the disclosure, the second code block size may be determined through [Equation 23] below in step 730 considered in embodiment 2, that is, the step of determining the second code block size when the transport block is segmented into code blocks.

$$K_-=22 \cdot a \cdot 2^{j_-}, \quad \text{[Equation 23]}$$

where $j_-$=maximum j s.t. $j<j_+$ and $j_+=\log_2(K_+/22 \cdot a)-1$

In [Equation 23] above, supportable code block sizes K may be defined as K=22·a·2j, where a={2, 3, 5, 7, 9, 11, 13, 15} and j={0, 1, 2, 3, 4, 5, 6, 7}. Accordingly, the first code block size may be defined as $K_+=22 \cdot a \cdot 2^{j_+}$, and the second code block size may be defined as $K_-=22 \cdot a \cdot 2^{j_-}$. According to [Equation 23] above, j_ among parameters for determining the second code block size may be determined to be the largest value smaller than $J_+$, and a among parameters for determining the second code blocks may be determined to be the same as a parameter a for determining the first code block size. For the condition of [Equation 13] above, that is, in determination of the second code block size, for example, condition 2-5-1 below should be satisfied in order to guarantee the sameness between maximum exponent matrices of the parity check matrix for code blocks having the first code block size and the second code block size.

Condition 2-5-1

The code block size K may be determined by a and j. For example, K=22·a·2j.

A maximum exponent matrix of a parity check matrix for a code block having the code block size K may be determined by a and j.

Maximum exponent matrices of a parity check matrix for a code block having the code block size K may be the same for different j values.

Maximum exponent matrices of a parity check matrix for a code block having the code block size K may be different for different a values.

Embodiment 2-6

In embodiment 2-6 of the disclosure, the second code block size may be determined through [Equation 24] below in step 730 considered in embodiment 2, that is, the step of determining the second code block size when the transport block is segmented into code blocks.

$$K_-=\text{maximum } K \text{ s.t. } K<K_+$$ [Equation 24]

According to [Equation 24], the second code block size may be determined as the largest code block size among code block sizes smaller than the first code block size.

Embodiment 3

Embodiment 3 of the disclosure provides a method of segmenting a transport block into code blocks.

Figure 8:
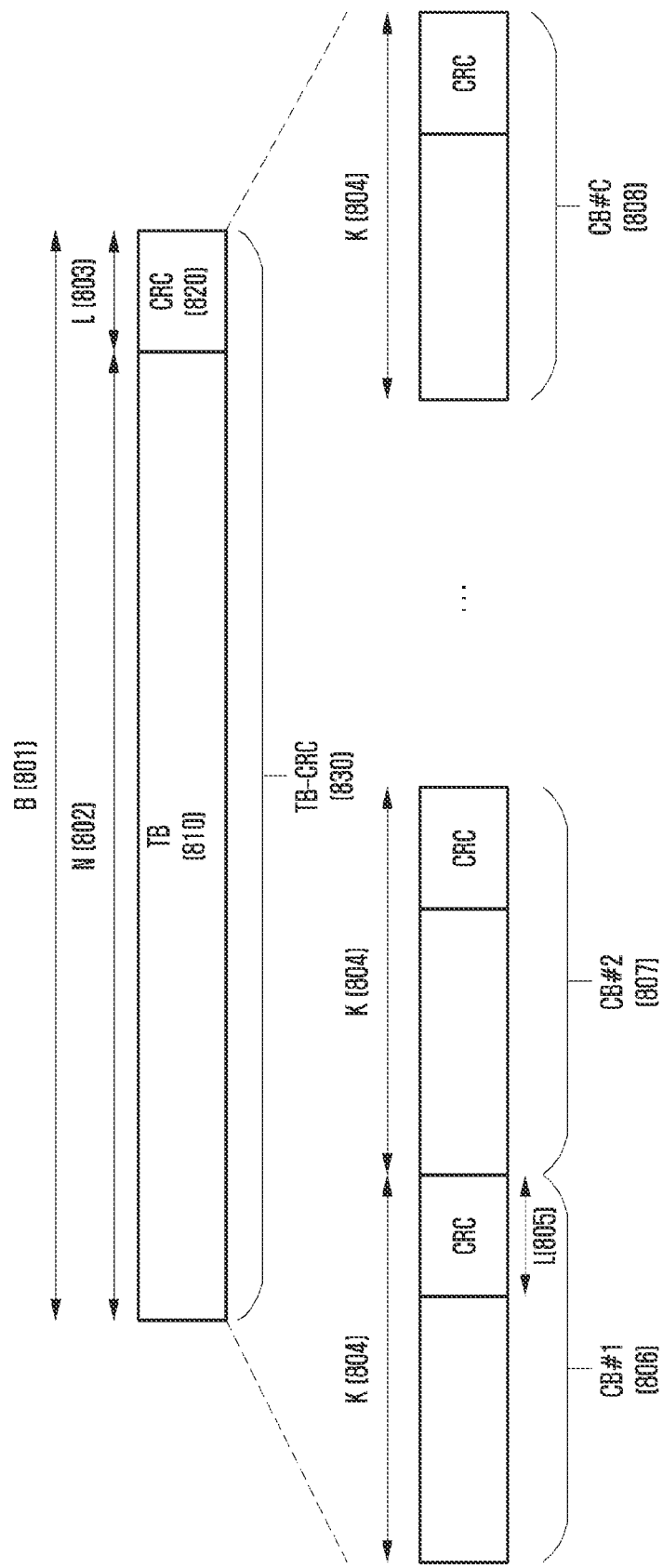
FIG. 8 illustrates an example of segmenting a transport block into code blocks according to embodiment 3.

FIG. 8 illustrates a method of segmenting a transport block into code blocks according to embodiment 3 of the disclosure. In FIG. 8, a transport block 810 having a length N 802 is illustrated, and a CRC 820 having a length L 803 may be inserted and thus a transport block 830 (TC-CRC), into which the CRC is inserted, having a total length of B 801 may be configured. FIG. 8 illustrates an example in which the TB-CRC 830 having the length B is segmented into a total of C CBs 806, 807, and 808. The segmented code blocks may have a code block size K, and the CRC 820 having the length L 805 may be inserted into each code block. The length L 805 of the CRC inserted into the CBs 806, 807, and 808 may be different from L 803 of the CRC 820 inserted into the TB 830. Further, the CRC inserted into the CB may be different from the CRC inserted into the TB.

Figure 9:
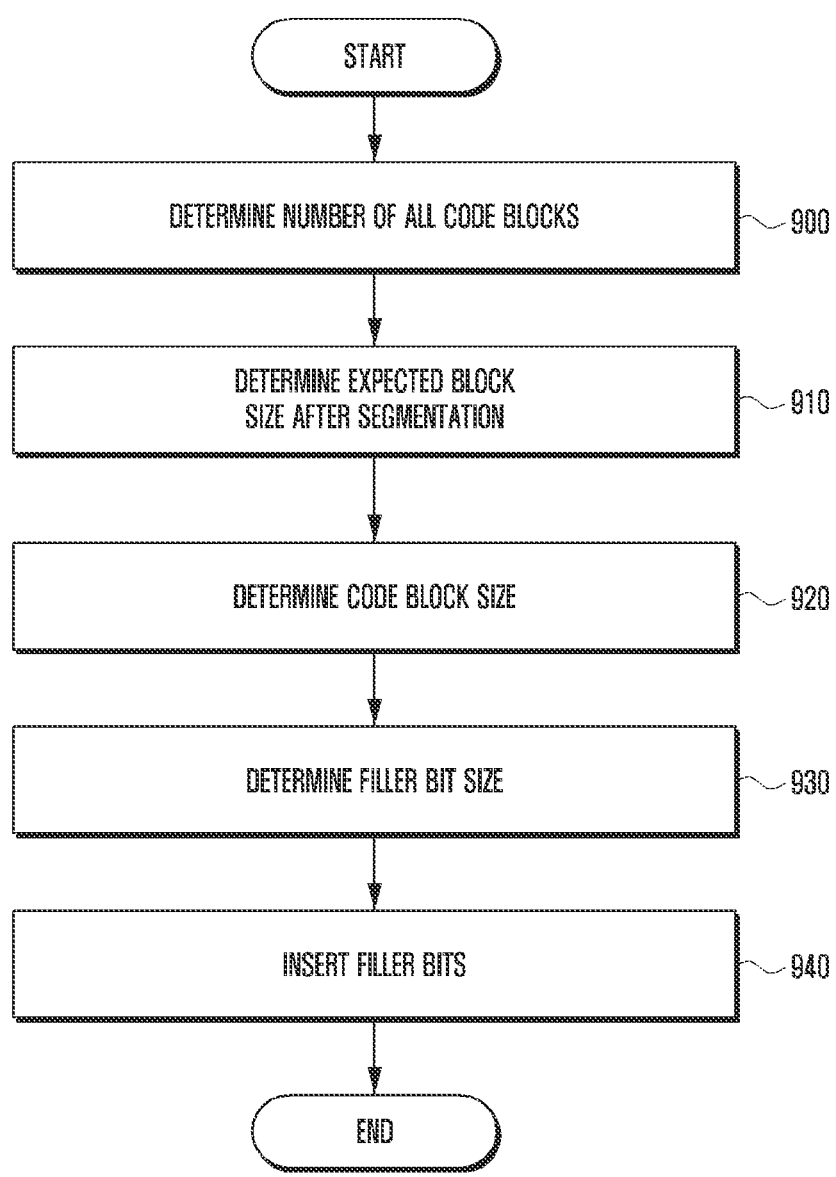
FIG. 9 illustrates a method of segmenting a transport block according to embodiment 3.

FIG. 9 illustrates a method of segmenting a transport block according to embodiment 3 of the disclosure. Referring to FIG. 9, embodiment 3 of the disclosure may include the following steps.

Step 900: determine the number (C) of all code blocks
Step 910: determine an expected size (B') after segmentation into code blocks
Step 920: determine a code block size (K)
Step 930: determine the number of filler bits
Step 940: insert filler bits Hereinafter, each step will be described in detail.

In step 900, the number (C) of all code blocks segmented from one transport block may be determined, which may be obtained through a method such as [Equation 25] below.

$$C=(B/(K_{max}-L))$$ [Equation 25]

Through [Equation 25] above, the number of code blocks generated after segmentation of the transport block may be minimized. $K_{max}$ may have a value, for example, 8448.

In step 910, the expected size B' of all blocks after segmentation into code blocks may be determined on the basis of the number of code blocks determined in step 900. This follows, for example, [Equation 62] below.

$$B'=B+C\cdot L$$ [Equation 26]

According to [Equation 26] above, the expected size B' after the segmentation into the code blocks may be determined by the size B, obtained by adding the transport block before the segmentation into the code blocks and the CRC for the transport block, and the size C·L of all CRCs added after the segmentation into the code blocks.

In step 920, the code block size K may be determined. The code block size may be determined to be the smallest value larger than B'/C. This may be indicated by [Equation 27] below.

$$K=\text{minimum } K \text{ s.t. } C\cdot K\geq B'$$ [Equation 27]

Through [Equation 27], a code block size which is the closest to the whole length B' after segmentation may be selected.

In step 930, the number of filler bits may be determined. This may be determined by, for example, [Equation 28] below.

$$F=C\cdot K-B'$$ [Equation 28]

In step 940, F filler bits determined in step 930 may be inserted into a specific code block. A method of inserting filler bits may follow, for example, embodiment 2-1 of the disclosure described above.

Embodiment 4

Embodiment 4 provides a method of obtaining and determining the transport block size (TBS) by the eNB and the terminal.

The eNB may identify (count) how many resource elements (REs) are used for data transmission while allocating frequency-time resources for scheduling to the terminal. For example, if the eNB allocates 10 PRBs from PRB 1 to PRB 10 and allocates 7 OFDM symbols to data transmission, a total of 10×12×7, that is, 840 REs are included in the allocated frequency-time resources. Among the 840 REs, REs other than REs used for DMRSs, REs used for channel state information-reference signal (CSI-RSs), and REs used for control channels that may exist may be used for mapping of data signals. Accordingly, the eNB and the terminal may know which REs are used for data transmission on the basis of allocation of the frequency-time resources. The frequency-time resources may be transferred to the terminal through physical layer or higher layer signaling.

Meanwhile, the eNB may inform the terminal of modulation and channel coding information for scheduling. For example, information on which modulation scheme such as QPSK, 16-QAM, 64-QAM, 256-QAM, and 1024-QAM is used for data transmission and information on a coding rate may be included. This may be called a modulation and coding scheme (MCS) and values thereof may be defined by a predetermined table. The eNB may insert only an index into DCI and transmit the DCI to the terminal. Information on a modulation order (interchangeably used with an MCS scheme) in the modulation information can also be transmitted. Modulation orders of QPSK, 16-QAM, 64-QAM, 256-QAM, and 1024-QAM are 2, 4, 6, 8, and 10, respectively.

The eNB obtains a final TBS through the following steps.

Step 1: obtain a temporary TBS per layer

Step 2: select a final TBS per layer

Step 3: obtain a final TBS

In step 1, a predetermined TBS per layer may be obtained through the following equation.

Temporary TBS per layer=MCS order×coding rate×number of allocated REs available for data transmission Or Temporary TBS per layer=value presented in MCS table× number of allocated REs available for data transmission The temporary TBS per layer may be obtained as described above. The value presented in the MCS table may be a value reflecting the coding rate and the MCS order.

The largest value smaller than the obtained temporary TBS per layer among values belonging to a TBS candidate set may be selected as the final TBS in step 2. For example, the TBS candidate set may include values in the following table. If the temporary TBS per layer obtained in step 1 is 2000, the largest value smaller than 2000 may be selected as the final TBS per layer. This is to secure an actual coding rate equal to or smaller than a coding rate aimed by the eNB.

16, 24, 32, 40, 56, 72, 88, 104, 120, 136, 144, 152, 176, 208, 224, 256, 280, 288, 296, 328, 336, 344, 376, 392, 408, 424, 440, 456, 472, 488, 504, 520, 536, 552, 568, 584, 600, 616, 632, 648, 680, 696, 712, 744, 776, 808, 840, 872, 904, 936, 968, 1000, 1032, 1064, 1096, 1128, 1160, 1192, 1224, 1256, 1288, 1320, 1352, 1384, 1416, 1480, 1544, 1608, 1672, 1736, 1800, 1864, 1928, 1992, 2024, 2088, 2152, 2216, 2280, 2344, 2408, 2472, 2536, 2600, 2664, 2728, 2792, 2856, 2984, 3112, 3240, 3368, 3496, 3624, 3752, 3880, 4008, 4136, 4264, 4392, 4584, 4776, 4968, 5160, 5352, 5544, 5736, 5992, 6200, 6456, 6712, 6968, 7224, 7480, 7736, 7992, 8248, 8504, 8760, 9144, 9528, 9912, 10296, 10680, 11064, 11448, 11832, 12216, 12576, 12960, 13536, 14112, 14688, 15264, 15840, 16416, 16992, 17568, 18336, 19080, 19848, 20616, 21384, 22152, 22920, 23688, 24496, 25456, 26416, 27376, 28336, 29296, 30576, 31704, 32856, 34008, 35160, 36696, 37888, 39232, 40576, 42368, 43816, 45352, 46888, 48936, 51024, 52752, 55056, 57336, 59256, 61664, 63776, 66592, 68808, 71112, 73712, 75376

In another example, among values belonging to the TBS candidate set, the smallest value larger than the obtained temporary TBS per layer may be selected as the final TBS in step 2.

In another example, step 2 may be omitted.

In another example, step 2 may be a step for making the temporary TB S per layer obtained in step 1 be a multiple of a specific integer. For example, in order to make the temporary TBS per layer be a multiple of N, N×ceil (temporary TBS per layer/N) or N×floor (temporary TBS per layer/N) may be determined as the final TBS. ceil(X) and floor(X) may be a minimum integer larger than X and a maximum integer larger than X, respectively. N may be fixed to an integer such as 8. N may be determined in consideration of the case in which the number of pieces of data transmitted in a higher layer such as MAC or RRC is a multiple of N.

In step 3, the final TBS may be obtained by multiplying the final TBS per layer, selected in step 2, and the number of layers.

In the TBS candidate set, elements and a maximum value may vary depending on a system frequency band, subcarrier spacing, and the number of OFDM symbols per slot. Further, the TBS candidate set may be prearranged between the eNB and the terminal or may be configured through higher layer signaling for data transmission.

The method of obtaining the TBS in step 3 may be replaced with the method of obtaining the TBS in step 2.

Step A: obtain a temporary TBS

Step B: select a final TBS

Step A may be obtained through the following equation.

Temporary TBS per layer=MCS order×coding rate×number of allocated REs available for data transmission× number of layers used for transmission Or Temporary TBS per layer=value presented in MCS table× number of allocated REs available for data transmission×number of layers used for transmission That is, the temporary TBS may be obtained by further considering the number of layers from step 1.

Step B is a process for obtaining the final TBS from the TBSs obtained in step A in consideration of a TBS candidate set and may be similar to step 2 described above.

Figure 10:
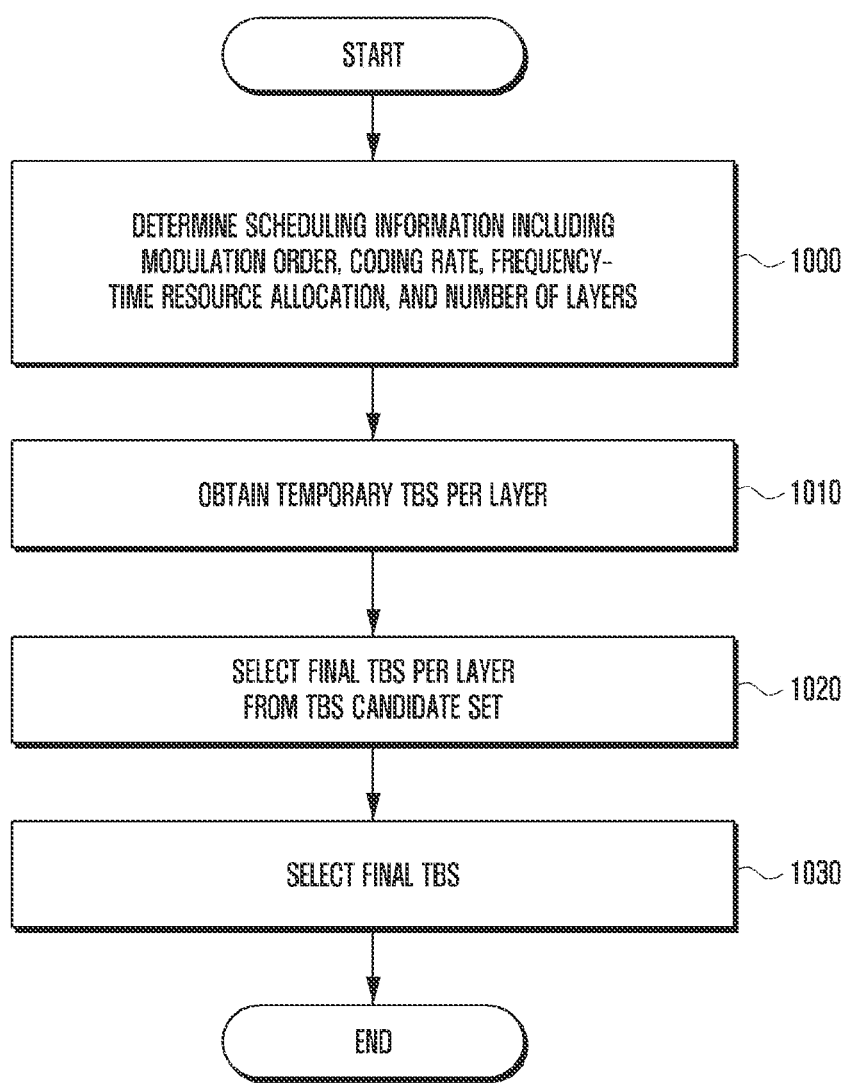
FIG. 10 is a flowchart illustrating an example of an operation in which the eNB obtains a TBS according to embodiment 4.
Figure 11:
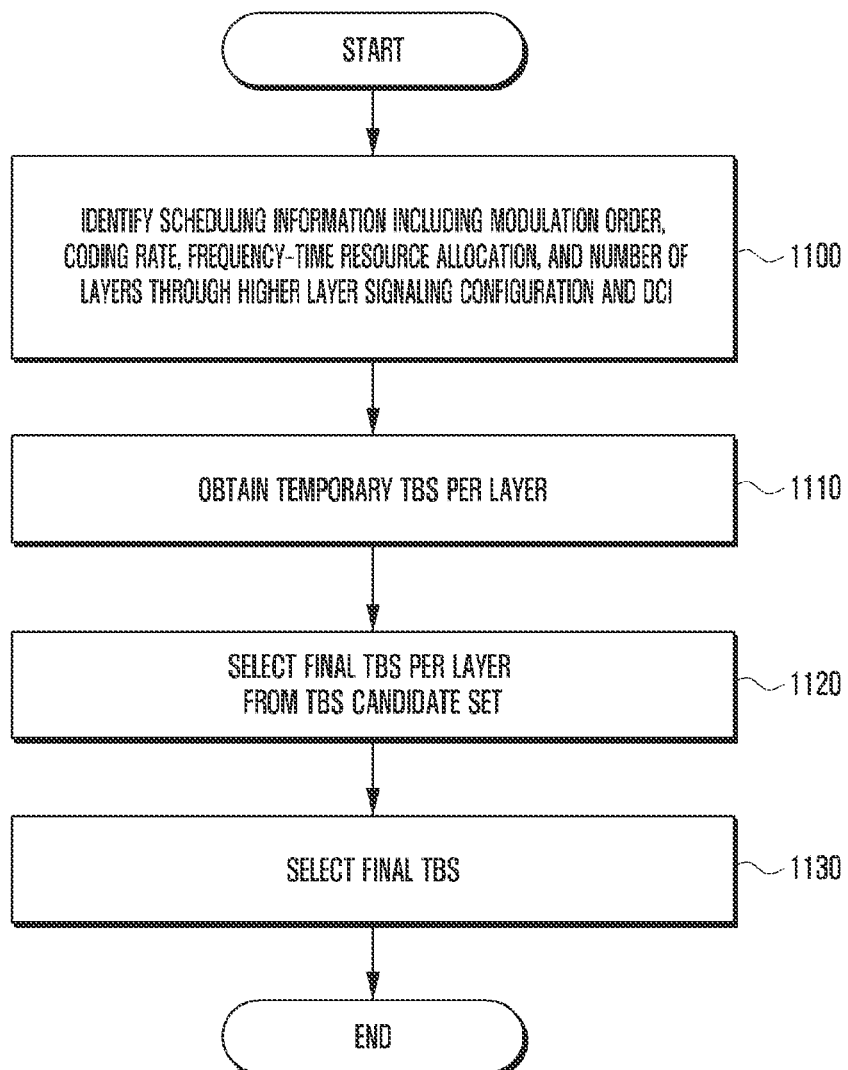
FIG. 11 is a flowchart illustrating an example of an operation in which the terminal obtains a TBS according to embodiment 4.

FIGS. 10 and 11 are flowcharts illustrating processes by which the eNB and the terminal obtain a TBS. Referring to FIG. 10, the eNB determines scheduling information including an MCS order, a coding rate, frequency-time resource allocation, and the number of layers in step 1000. Thereafter, the eNB obtains a temporary TBS per layer through the following equation based on the information in step 1010.

Temporary TBS per layer=MCS order×coding rate×number of allocated REs available for data transmission Or Temporary TBS per layer=value presented in MCS table× number of allocated REs available for data transmission Thereafter, the eNB selects a final TBS per layer from a TBS candidate set prearranged between the eNB and the terminal in step 1020, and identifies a final TBS by multiplying the final TBS per layer and the number of layers in step 1030.

Referring to FIG. 11, the terminal identifies scheduling information including an MCS order, a coding rate, frequency-time resource allocation, and the number of layers through higher layer signaling of DCI in step 1100. The eNB and the terminal obtain a temporary TBS per layer through the following equation based on the information in step 1110.

Temporary TBS per layer=MCS order×coding rate×number of allocated REs available for data transmission Or Temporary TBS per layer=value presented in MCS table× number of allocated REs available for data transmission Thereafter, the terminal selects a final TBS per layer from a TBS candidate set prearranged between the eNB and the terminal in step 1120. Subsequently, the terminal identifies a final TBS by multiplying the final TBS per layer and the number of layers in step 1130. A method of obtaining the final TBS from the final TBS per layer can be determined on the basis of a specific rule as well as the simple multiplication method.

Figure 12:
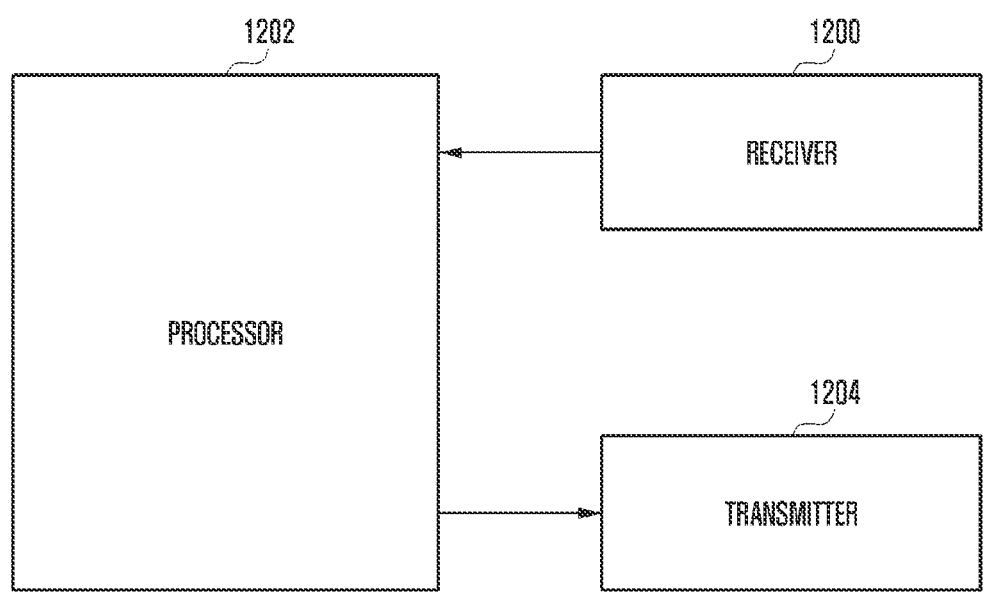
FIG. 12 is a block diagram illustrating the structure of the terminal according to embodiments.

FIG. 12 is a block diagram illustrating the structure of the terminal according to embodiments of the disclosure.

Referring to FIG. 12, the terminal according to the embodiment may include a receiver 1200, a transmitter 1201, and a processor 1202. The receiver 1200 and the transmitter 1204 may be collectively called a transceiver in an embodiment. The transceiver may transmit and receive a signal to and from the eNB. The signal may include downlink control information and data. To this end, the transceiver includes an RF transmitter that up-converts and amplifies a frequency of a transmitted signal and an RF receiver that low-noise amplifies a received signal and down-converts the frequency. The transceiver may receive a signal through a radio channel, output the signal to the processor 1202, and transmit the signal output from the processor 1202 through a radio channel. The processor 1202 may control a series of processes such that the terminal may operate according to the aforementioned embodiment.

Figure 13:
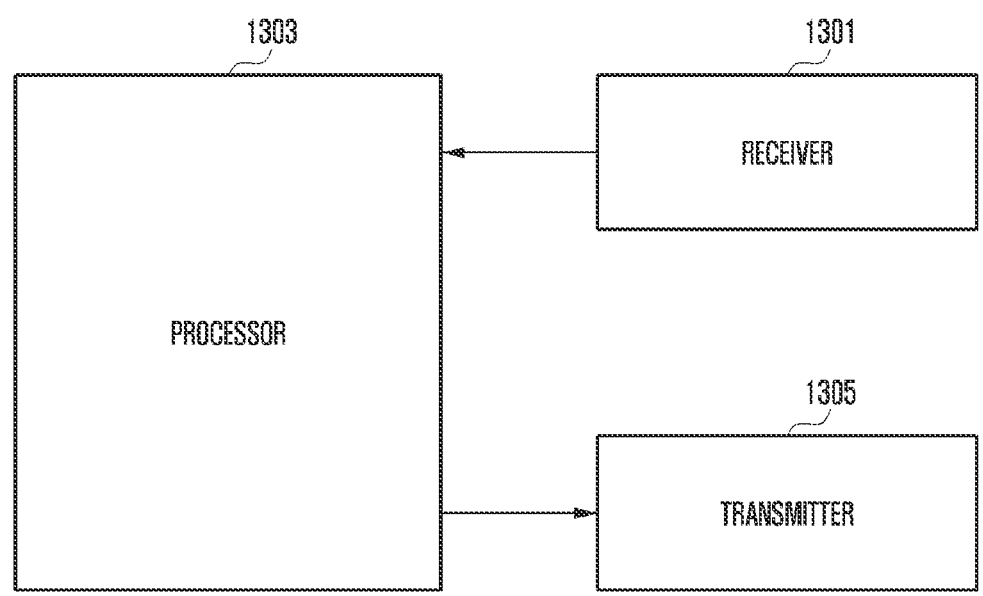
FIG. 13 is a block diagram illustrating the structure of the eNB according to embodiments.

FIG. 13 is a block diagram illustrating the structure of the eNB according to embodiments of the disclosure.

Referring to FIG. 13, the eNB according to the disclosure may include at least one of a receiver 1301, a transmitter 1305, and a processor 1303. The receiver 1301 and the transmitter 1305 may be collectively called a transceiver in an embodiment of the disclosure. The transceiver may transmit and receive a signal to and from the terminal. The signal may include downlink control information and data. To this end, the transceiver includes an RF transmitter that up-converts and amplifies a frequency of a transmitted signal and an RF receiver that low-noise amplifies a received signal and down-converts the frequency. The transceiver may receive a signal through a radio channel, output the signal to the processor 1303, and transmit the signal output from the processor 1303 through a radio channel. The processor 1303 may control a series of processes such that the eNB may operate according to the aforementioned embodiment of the disclosure.

Meanwhile, the embodiments of the disclosure disclosed in this specification and the drawings have been presented to easily explain technical contents of the disclosure and help comprehension of the disclosure, and do not limit the scope of the disclosure. That is, it is obvious to those skilled in the art to which the disclosure belongs that different modifications can be achieved based on the technical spirit of the disclosure. Further, if necessary, the above respective embodiments may be employed in combination. For example, some of embodiment 1, embodiment 2, and embodiment 3 of the disclosure may be combined, and the eNB and the terminal may operate therethrough. Although the embodiments are presented on the basis of the NR system, other medication examples based on technical idea of the embodiments can be applied to other systems such as an FDD or TDD LTE system.

Although exemplary embodiments of the disclosure have been shown and described in this specification and the drawings, they are used in general sense in order to easily explain technical contents of the disclosure, and to help comprehension of the disclosure, and are not intended to limit the scope of the disclosure. It is obvious to those skilled in the art to which the disclosure pertains that other modified embodiments on the basis of the spirits of the disclosure besides the embodiments disclosed herein can be carried out.

What is claimed is:

1. A method performed by a user equipment (UE) in a communication system, the method comprising:
receiving, from a base station, downlink control information (DCI) including resource assignment information for a physical downlink shared channel (PDSCH);
identifying a number of resource elements (REs) allocated for the PDSCH based on a number symbols for the PDSCH and a number of allocated physical resource blocks (PRBs), wherein a number of REs for a demodulation reference signal (DMRS) is excluded for defining the number of REs allocated for the PDSCH;
identifying a first value N1 corresponding to intermediate information, wherein the first value N1 corresponding to the intermediate information is based on the number of REs allocated for the PDSCH and a number of layers;
identifying a transport block size (TBS) based on a second value N2 corresponding to quantized intermediate information, wherein the second value N2 corresponding to the quantized intermediate information is defined based on $N_1/N$, where N is an integer; and
receiving, from the base station, the PDSCH based on the TBS.

2. The method of claim 1, wherein the second value N2 corresponding to the quantized intermediate information is defined based on $N*\lfloor N_1/N \rfloor$.

3. The method of claim 1, wherein the second value N2 corresponding to the quantized intermediate information is a multiple of 8.

4. The method of claim 1, wherein the first value N1 corresponding to the intermediate information is further based on a modulation order, and a coding rate.

5. The method of claim 1, wherein a number of REs associated with a channel state information reference signal (CSI-RS) and a number of REs associated with a control channel are further excluded from the number of REs allocated for the PDSCH.

6. A method performed by a base station in a communication system, the method comprising:
identifying a transport block size (TBS) for a physical downlink shared channel (PDSCH);
transmitting, to a user equipment (UE), downlink control information (DCI) including resource assignment information for the PDSCH; and
transmitting, to the UE, the PDSCH according to the TBS,
wherein the TBS is associated with a second value N2 corresponding to quantized intermediate information, wherein the quantized intermediate information is defined based on $N_1/N$, where N is an integer,
wherein a first value N1 corresponding to intermediate information is associated with a number of resource elements (REs) allocated for the PDSCH and a number of layers,
wherein the number of REs allocated for the PDSCH is associated with a number symbols for the PDSCH and a number of allocated physical resource blocks (PRBs), and
wherein a number of REs for a demodulation reference signal (DMRS) is excluded for defining the number of REs allocated for the PDSCH.

7. The method of claim 6, wherein the second value N2 corresponding to the quantized intermediate information is defined based on $N*\lfloor N_1/N \rfloor$.

8. The method of claim 6, wherein e first value N1 corresponding to the intermediate information is associated with a modulation order and a coding rate.

9. The method of claim 6, wherein the second value N2 corresponding to the quantized intermediate information is a multiple of 8.

10. The method of claim 6, wherein a number of REs associated with a channel state information reference signal (CSI-RS) and a number of REs associated with a control channel are further excluded from the number of REs allocated for the PDSCH.

11. A user equipment (UE) in a communication system, the UE comprising:
a transceiver; and
at least one processor configured to:
receive, from a base station, downlink control information (DCI) including resource assignment information for a physical downlink shared channel (PDSCH),
identify a number of resource elements (REs) allocated for the PDSCH based on a number symbols for the PDSCH and a number of allocated physical resource blocks (PRBs), wherein a number of REs for a demodulation reference signal (DMRS) is excluded for defining the number of REs allocated for the PDSCH,
identify a first value N1 corresponding to intermediate information, wherein the first value N1 corresponding to the intermediate information is based on the number of REs allocated for the PDSCH and a number of layers,
identify a transport block size (TBS) based on a second value N2 corresponding to quantized intermediate information, wherein the second value N2 corresponding to the quantized intermediate information is defined based on $N_1/N$, where N is an integer, and
receive, from the base station, the PDSCH based on the TBS.

12. The UE of claim 11, wherein the second value N2 corresponding to the quantized intermediate information is defined based on $N*\lfloor N_1/N \rfloor$.

13. The UE of claim 11, wherein the second value N2 corresponding to the quantized intermediate information is a multiple of 8.

14. The UE of claim 11, wherein the first value N1 corresponding to the intermediate information is further based on a modulation order and a coding rate.

15. The UE of claim 11, wherein a number of REs associated with a channel state information reference signal (CSI-RS) and a number of REs associated with a control channel are further excluded from the number of REs allocated for the PDSCH.

16. A base station in a communication system, the base station comprising:
a transceiver; and
at least one processor configured to:
identify a transport block size (TBS) for a physical downlink shared channel (PDSCH),
transmit, to a user equipment (UE), downlink control information (DCI) including resource assignment information for the PDSCH, and
transmit, to the UE, the PDSCH according to the TBS,
wherein the TBS is associated with a second value N2 corresponding to quantized intermediate information, wherein the quantized intermediate information is defined based on $N_1/N$, where N is an integer,
wherein a first value N1 corresponding to intermediate information is associated with a number of resource elements (REs) allocated for the PDSCH and a number of layers,
wherein the number of REs allocated for the PDSCH is associated with a number symbols for the PDSCH and a number of allocated physical resource blocks (PRBs), and
wherein a number of REs for a demodulation reference signal (DMRS) is excluded for defining the number of REs allocated for the PDSCH.

17. The base station of claim 16, wherein the second value N2 corresponding to the quantized intermediate information is defined based on $N*\lfloor N_1/N \rfloor$.

18. The base station of claim 16, wherein the first value N1 corresponding to the intermediate information is associated with a modulation order and a coding rate.

19. The base station of claim 16, wherein the second value N2 corresponding to the quantized intermediate information is a multiple of 8.

20. The base station of claim 16, wherein a number of REs associated with a channel state information reference signal (CSI-RS) and a number of REs associated with a control channel are further excluded from the number of REs allocated for the PDSCH.

* * * * *